(12) United States Patent
Kim et al.

(10) Patent No.: US 12,464,779 B2
(45) Date of Patent: Nov. 4, 2025

(54) SEMICONDUCTOR DEVICE AND METHOD FOR FABRICATING THE SAME

(71) Applicant: Samsung Electronics Co., Ltd., Suwon-si (KR)

(72) Inventors: Dong Woo Kim, Suwon-si (KR); Jin Bum Kim, Suwon-si (KR); Sang Moon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 437 days.

(21) Appl. No.: 18/138,825

(22) Filed: Apr. 25, 2023

(65) Prior Publication Data

US 2024/0006409 A1 Jan. 4, 2024

(30) Foreign Application Priority Data

Jun. 29, 2022 (KR) .................. 10-2022-0079427

(51) Int. Cl.
*H10D 30/67* (2025.01)
*H10D 84/01* (2025.01)
(Continued)

(52) U.S. Cl.
CPC ..... *H10D 30/6757* (2025.01); *H10D 84/0126* (2025.01); *H10D 84/038* (2025.01); *H10D 84/83* (2025.01)

(58) Field of Classification Search
CPC .............. H10D 30/01; H10D 30/014; H10D 30/019–0198; H10D 30/0273; H10D 30/43; H10D 30/435; H10D 30/501–509; H10D 30/6735; H10D 30/674; H10D 30/6757; H10D 62/121; H10D 62/371; H10D 62/405; H10D 62/822; H10D 62/83; H10D 64/017; H10D 64/254; H10D 64/256; H10D 64/257; H10D 84/0126; H10D 84/0128; H10D 84/013; H10D 84/0193; H10D 84/83; H10D 84/8311; H10D 84/8312; H10D 84/83125; H10D 84/83135; H10D 84/83138; H10D 84/8314;
(Continued)

(56) References Cited

U.S. PATENT DOCUMENTS 7,176,041 B2 2/2007 Lee et al.
7,402,483 B2 7/2008 Yun et al.
(Continued)

*Primary Examiner* — Cheung Lee
(74) *Attorney, Agent, or Firm* — Muir Patent Law, PLLC

(57) ABSTRACT

There is provided a semiconductor device including an active pattern which includes a lower pattern extending in a first direction and a plurality of sheet patterns spaced apart from the lower pattern in a second direction on a substrate, the lower pattern including a protruding pattern protruding from the substrate in the second direction, and a capping pattern being in contact with the protruding pattern on the protruding pattern, a first gate structure and a second gate structure which are disposed on the lower pattern and spaced apart from each other in the first direction, and a source/drain pattern which is disposed on the lower pattern and in contact with the sheet pattern, wherein a thickness of the capping pattern in a portion that overlaps the first gate structure is different from a thickness of the capping pattern in a portion that overlaps the second gate structure.

20 Claims, 34 Drawing Sheets

(51) Int. Cl.
*H10D 84/03* (2025.01)
*H10D 84/83* (2025.01)

(58) Field of Classification Search
CPC ..... H10D 84/8316; H10D 84/832–833; H10D 84/835; H10D 84/836; H10D 84/837–839
See application file for complete search history.

(56) References Cited

U.S. PATENT DOCUMENTS

| | | |
|---|---|---|
| 7,709,277 B2 | 5/2010 | Lee et al. |
| 9,218,954 B2 | 12/2015 | Singh et al. |
| 9,312,183 B1 | 4/2016 | Kim et al. |
| 10,738,394 B2 | 8/2020 | Kang et al. |
| 11,056,592 B2 | 7/2021 | Jambunathan et al. |
| 11,239,075 B2 | 2/2022 | Wu et al. |
| 2019/0103267 A1 | 4/2019 | Chen et al. |
| 2020/0035567 A1* | 1/2020 | Chanemougame ........................ H10D 84/0193 |
| 2021/0305388 A1 | 9/2021 | Lilak et al. |

* cited by examiner

SEMICONDUCTOR DEVICE AND METHOD FOR FABRICATING THE SAME

CROSS-REFERENCE TO RELATED APPLICATION

This application claims priority under 35 U.S.C. § 119 from Korean Patent Application No. 10-2022-0079427, filed on Jun. 29, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a semiconductor device, and more specifically, to a semiconductor device including an MBCFET™ (Multi-Bridge Channel Field Effect Transistor).

Description of the Related Art

As one of scaling technologies for increasing density of semiconductor devices, a multi gate transistor in which a multi-channel active pattern (or a silicon body) having a fin or nanowire shape is formed on a substrate and a gate is formed on a surface of the multi-channel active pattern has been proposed.

Since such a multi gate transistor utilizes a three-dimensional channel, scaling may be performed. Further, even if a gate length of the multi gate transistor is not increased, the current control capability may be improved. Furthermore, a SCE (short channel effect) in which potential of a channel region is influenced by a drain voltage may be effectively suppressed.

SUMMARY

Aspects of the present disclosure provide a semiconductor device capable of improving element performance and reliability.

Aspects of the present disclosure also provide a method for fabricating a semiconductor device capable of improving element performance and reliability.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising an active pattern which includes a lower pattern extending lengthwise in a first direction and a plurality of sheet patterns spaced apart from the lower pattern in a second direction on a substrate, the lower pattern including a protruding pattern protruding from the substrate in the second direction, and a capping pattern on and contacting the protruding pattern, a first gate structure and a second gate structure which are disposed on the lower pattern and spaced apart from each other in the first direction, and a source/drain pattern which is disposed on the lower pattern and in contact with the plurality of sheet patterns, wherein a thickness of the capping pattern in a portion that overlaps the first gate structure is different from a thickness of the capping pattern in a portion that overlaps the second gate structure.

According to another aspect of the present disclosure, there is provided a semiconductor device comprising an active pattern which includes a lower pattern extending lengthwise in a first direction and a plurality of sheet patterns spaced apart from the lower pattern in a second direction on a substrate, the lower pattern including a protruding pattern protruding from the substrate in the second direction, and a capping pattern on and contacting the protruding pattern, a first gate structure including a gate electrode and a gate insulating film on the lower pattern, and a source/drain pattern which is disposed on the lower pattern and in contact with the plurality of sheet patterns, wherein the first gate structure includes an inner gate structure which is disposed between the lower pattern and an adjacent sheet pattern, and between sheet patterns adjacent in the second direction, wherein the inner gate structure includes the gate electrode and the gate insulating film, wherein the gate insulating film of the inner gate structure is in contact with an upper surface of the capping pattern, wherein each of the plurality of sheet patterns includes an upper surface and a lower surface that are opposite to each other in the second direction, and each of the upper surface and the lower surface of each of the plurality of sheet patterns has a (110) crystal plane.

According to still another aspect of the present disclosure, there is provided a semiconductor device comprising a substrate including a (110) silicon wafer, an active pattern which includes a lower pattern extending lengthwise in a first direction and a plurality of sheet patterns spaced apart from the lower pattern in a second direction on the substrate, the lower pattern including a protruding pattern protruding from the substrate in the second direction, and a first capping on and contacting the protruding pattern, a first gate structure and a second gate structure disposed on the lower pattern and spaced apart from each other in the first direction, and a source/drain pattern which is disposed on the lower pattern and in contact with the sheet pattern, wherein a thickness of the first capping pattern in a portion that overlaps the first gate structure is different from a thickness of the first capping pattern in a portion that overlaps the second gate structure, wherein each of the plurality of sheet patterns includes an upper surface and a lower surface that are opposite in the second direction, and wherein each of the upper surface and the lower surface of each of the plurality of sheet patterns has a (110) crystal plane.

BRIEF DESCRIPTION OF DRAWINGS

The above and other aspects and features of the present disclosure will become more apparent by describing in detail illustrative embodiments thereof with reference to the attached drawings, in which like numbers refer to like elements throughout. In the drawings.

DETAILED DESCRIPTION OF THE EMBODIMENTS

A semiconductor device according to example embodiments may include a tunneling transistor (tunneling FET), a three-dimensional (3D) transistor or two-dimensional material-based transistor (2D material-based FETs), and a heterogeneous structure thereof. Further, the semiconductor device according to example embodiments may include a bipolar junction transistor, a laterally-diffused metal-oxide semiconductor (LDMOS), and the like.

As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The semiconductor device according to example embodiments will be described with reference to FIGS. 1 to 6.

Figure 1:
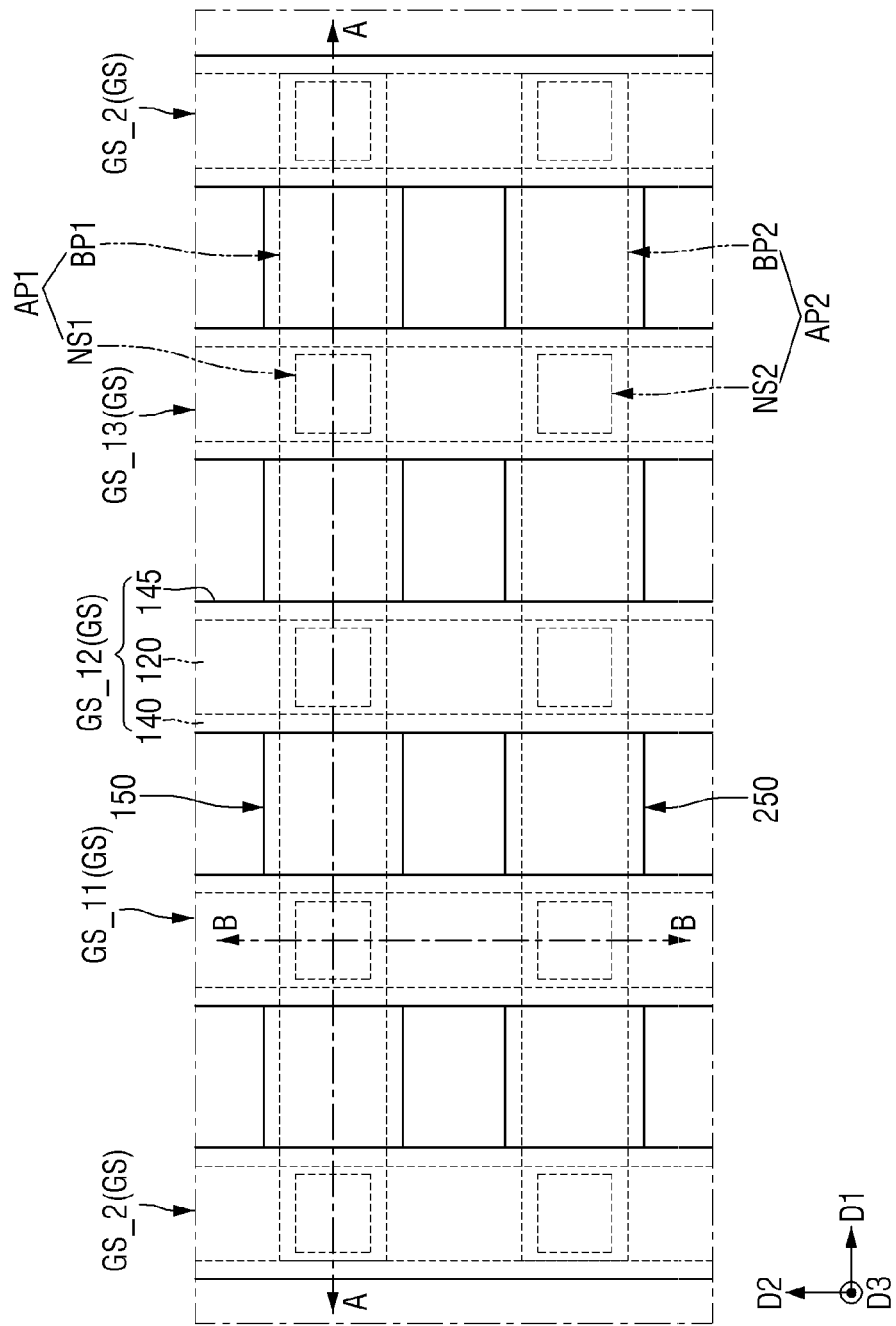
FIG. 1 is an exemplary plan view for explaining the semiconductor device according to example embodiments.
Figure 2:
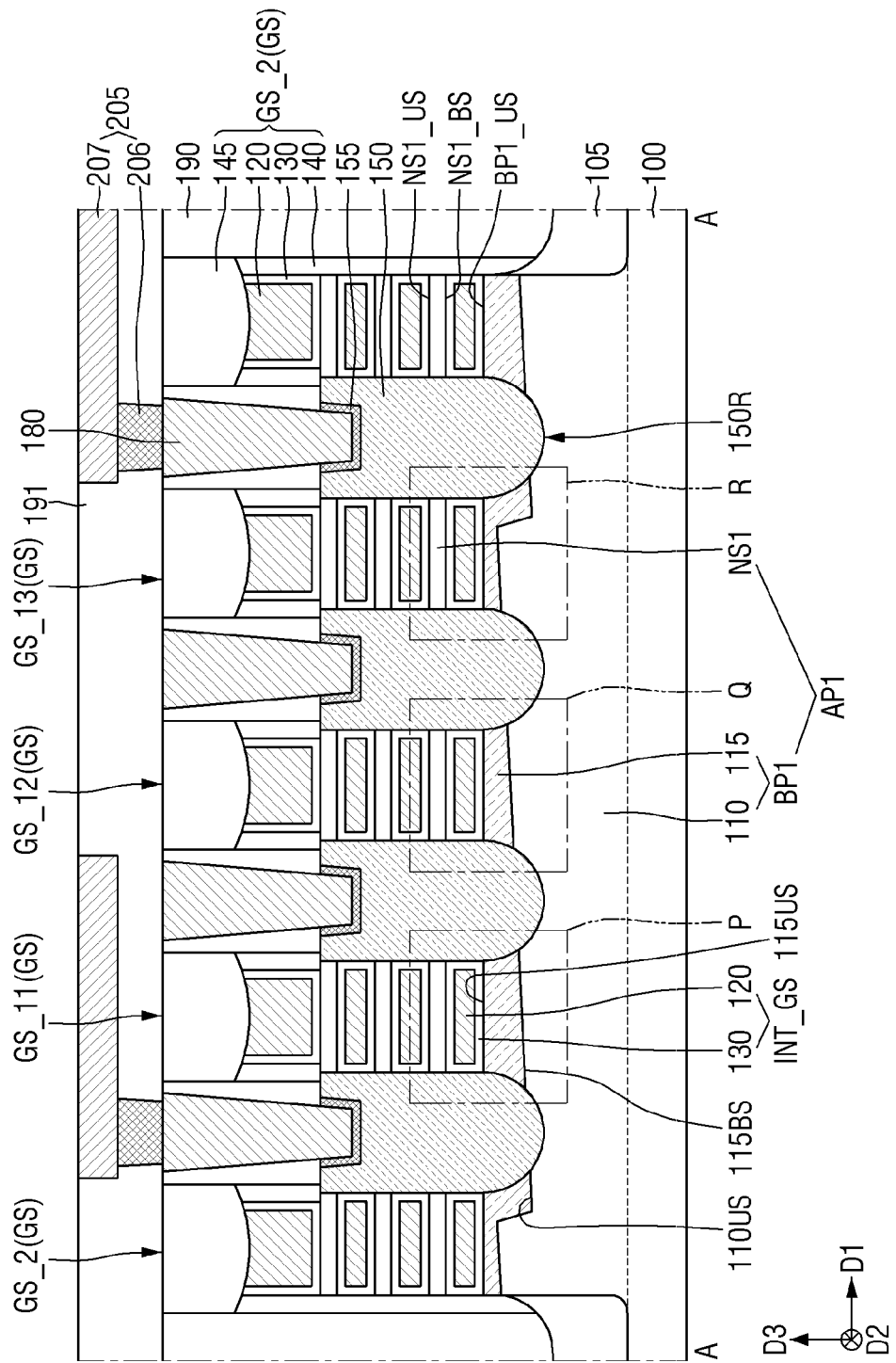
FIGS. 2 and 3 are cross-sectional views taken along A-A and B-B, respectively, of FIG. 1.
Figure 3:
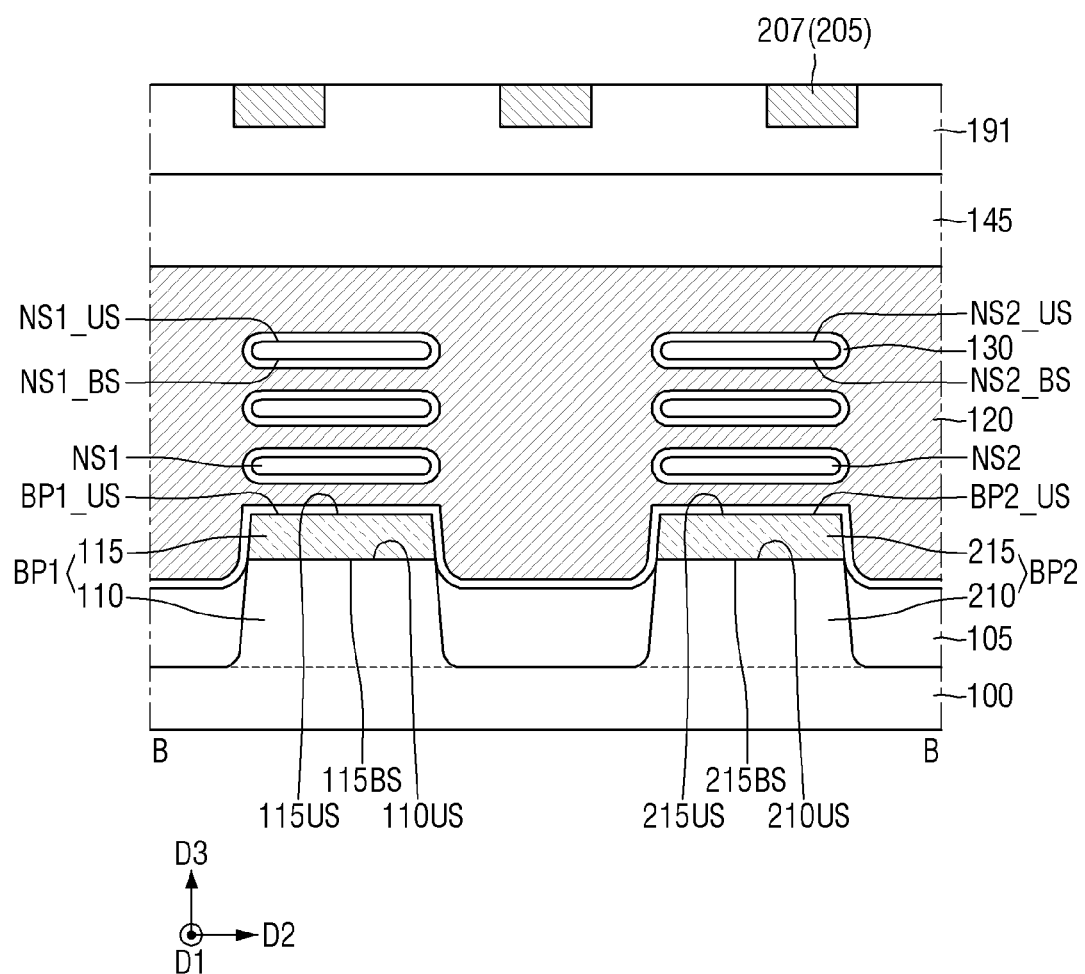
Figure 4:
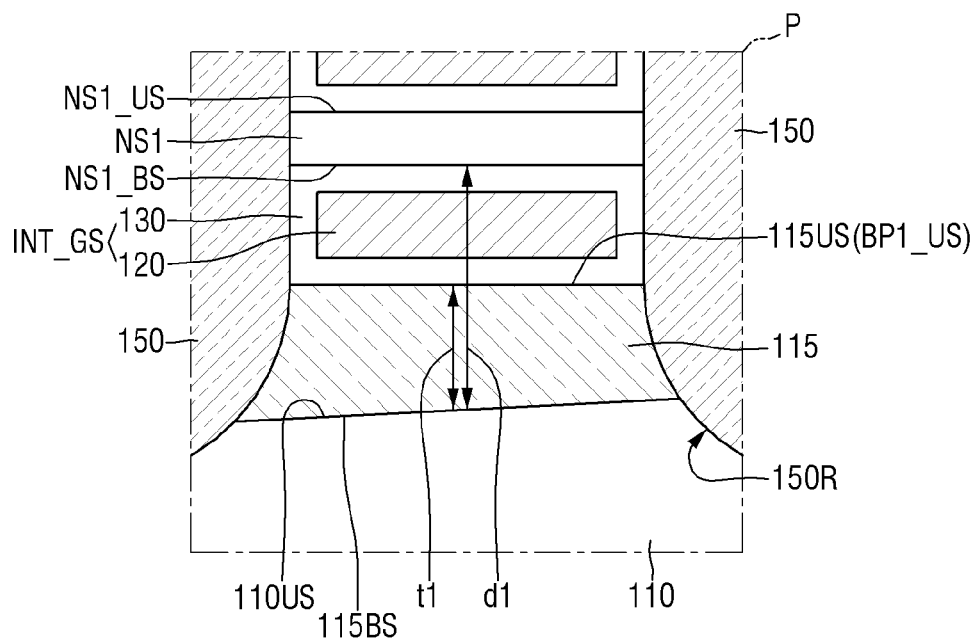
FIG. 4 is an enlarged view of a portion P of FIG. 2.
Figure 5:
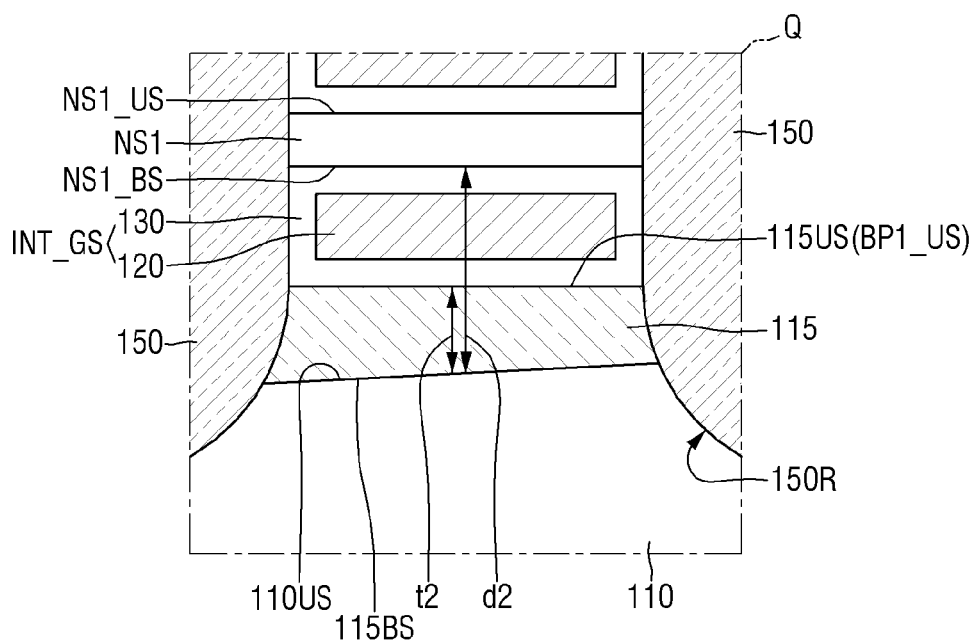
FIG. 5 is an enlarged view of a portion Q of FIG. 2.
Figure 6:
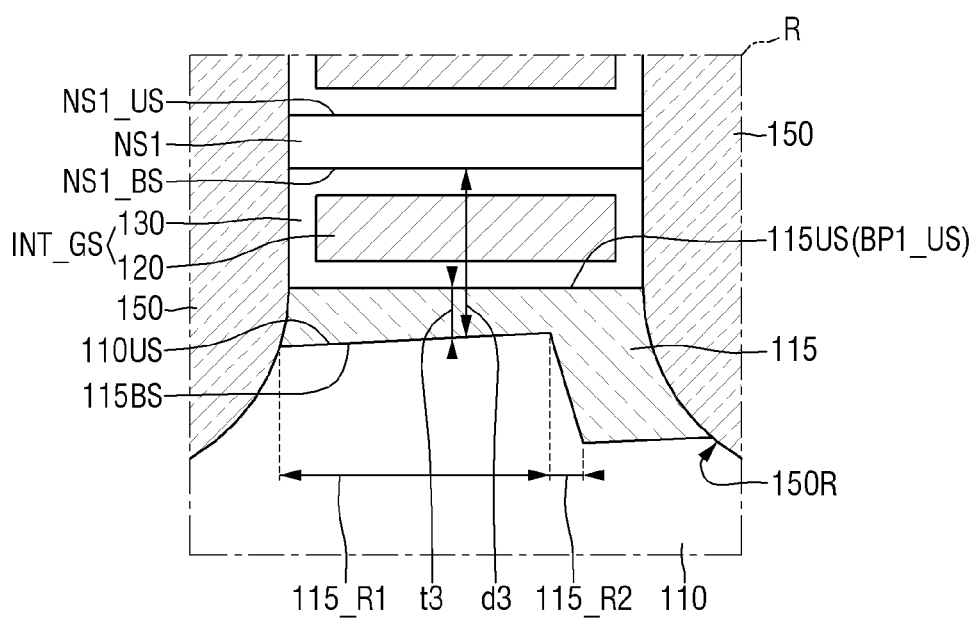
FIG. 6 is an enlarged view of a portion R of FIG. 2.

FIG. 1 is an exemplary plan view for explaining the semiconductor device according to example embodiments. FIGS. 2 and 3 are cross-sectional views taken along A-A and B-B, respectively, of FIG. 1. FIG. 4 is an enlarged view of a portion P of FIG. 2. FIG. 5 is an enlarged view of a portion Q of FIG. 2. FIG. 6 is an enlarged view of a portion R of FIG. 2.

For reference, FIG. 1 is simply shown except for a gate insulating film 130, interlayer insulating films 190 and 191, a wiring structure 205, and the like. Further, although not shown, a cross-sectional view taken in a first direction D1 along a second lower pattern BP2 may be substantially the same as that shown in FIG. 2.

Referring to FIGS. 1 to 6, the semiconductor device according to example embodiments may include a substrate 100, a first lower pattern BP1, a second lower pattern BP2, a first sheet pattern NS1, a second sheet pattern NS2, a plurality of gate structures GS, a first source/drain pattern 150, and a second source/drain pattern 250.

In some embodiments, the substrate 100 may be bulk silicon or silicon-on-insulator (SOI). In other embodiments, the substrate 100 may be a silicon substrate, or may include, but not be limited to, other materials, for example, silicon germanium, SGOI (silicon germanium on insulator), indium antimonide, lead tellurium compounds, indium arsenic, indium phosphide, gallium arsenide, or gallium antimonide.

The substrate 100 may include a (110) semiconductor wafer. The (110) semiconductor wafer is a semiconductor wafer oriented in a (110) plane. In the semiconductor device according to example embodiments, the substrate 100 may include a (110) silicon wafer. The substrate 100 may include a silicon wafer oriented in the (110) plane. As an example, the substrate 100 may be a (110) silicon wafer. As another example, if the substrate 100 is an SOI substrate, a portion in which semiconductor elements such as gate electrodes are formed may be made up of the (110) silicon wafer.

The first lower pattern BP1 may protrude from the substrate 100 in a third direction D3. The first lower pattern BP1 may extend lengthwise in a first direction D1. The first lower pattern BP1 includes a long side extending in the first direction D1 and a short side extending in a second direction D2. An end of the first lower pattern BP1 may include the short side of the first lower pattern BP1. The first and second directions D1 and D2 may be perpendicular to one another, and the third direction D3 may be perpendicular to both the first and second directions D1 and D2.

The first lower pattern BP1 may include a first protruding pattern 110 protruding from the substrate 100 in the third direction D3, and a first capping pattern 115 on the first protruding pattern 110. The first capping pattern 115 is in contact with the first protruding pattern 110. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

A lower surface 115BS of the first capping pattern faces the upper surface 110US of the first protruding pattern. A lower surface 115BS of the first capping pattern is in contact with the upper surface 110US of the first protruding pattern. An upper surface BP1_US of the first lower pattern may be an upper surface 115US of the first capping pattern. The lower surface 115BS of the first capping pattern and the upper surface 115US of the first capping pattern are opposite to each other in the third direction D3.

The second lower pattern BP2 may protrude from the substrate 100 in the third direction D3. The second lower pattern BP2 may extend lengthwise in the first direction D1. The second lower pattern BP2 may be spaced apart from the first lower pattern BP1 in the second direction D2. An end of the second lower pattern BP2 may include the short side of the second lower pattern BP2.

The second lower pattern BP2 may include a second protruding pattern 210 protruding from the substrate 100 in the third direction D3, and a second capping pattern 215 on the second protruding pattern 210. The second capping pattern 215 is in contact with the second protruding pattern 210.

A lower surface 215BS of the second capping pattern faces the upper surface 210US of the second protruding pattern. The lower surface 215BS of the second capping pattern is in contact with the upper surface 210US of the second protruding pattern. The upper surface BP2_US of the second lower pattern may be an upper surface 215US of the second capping pattern. The lower surface 215BS of the second capping pattern and the upper surface 215US of the second capping pattern are opposite to each other in the third direction D3.

The shape of the first capping pattern 115 and the second capping pattern 215 will be described below.

As an example, one of the first lower pattern BP1 and the second lower pattern BP2 may be disposed in an NMOS formation region, and the other may be disposed in a PMOS formation region. As another example, the first lower pattern BP1 and the second lower pattern BP2 may be disposed in the PMOS formation region. As still another example, the first lower pattern BP1 and the second lower pattern BP2 may be disposed in the NMOS formation region.

Each of the first protruding pattern 110 and the second protruding pattern 210 may be formed by etching a part of the substrate 100, and may include an epitaxial layer grown from the substrate 100. The first protruding pattern 110 and the second protruding pattern 210 may each include silicon or germanium which is an elemental semiconductor material. Also, the first protruding pattern 110 and the second protruding pattern 210 may each include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge) and tin (Sn), or a compound obtained by doping these elements with a group IV element.

The group III-V compound semiconductor may be, for example, one of a binary compound, a ternary compound, or a quaternary compound formed by combining at least one of aluminum (Al), gallium (Ga), and indium (In) as a group III element with one of phosphorus (P), arsenic (As), and antimony (Sb) as a group V element.

The first protruding pattern 110 and the second protruding pattern 210 include the same material. In the semiconductor device according to some embodiments, the first protruding pattern 110 and the second protruding pattern 210 may each be a silicon protruding pattern including silicon. For example, the first protruding pattern 110 and the second protruding pattern 210 may be formed of silicon oriented in the (110) plane.

The first capping pattern 115 and the second capping pattern 215 may be, for example, a single film. The first capping pattern 115 and the second capping pattern 215 include the same material.

The first capping pattern 115 and the second capping pattern 215 may include, for example, one of an undoped silicon film, a silicon germanium film, and a carbon-doped silicon film. When the first protruding pattern 110 and the second protruding pattern 210 are silicon protruding patterns, and the first capping pattern 115 and the second capping pattern 215 are undoped silicon films, a boundary between the first protruding pattern 110 and the first capping pattern 115, and a boundary between the second protruding pattern 210 and the second capping pattern 215 may not be distinguished.

The plurality of first sheet patterns NS1 may be disposed on the first lower pattern BP1. The plurality of first sheet patterns NS1 may overlap the first lower pattern BP1 in the third direction D3. The first lower pattern BP1 and the plurality of first sheet patterns NS1 may be included in the first active pattern AP1.

The plurality of first sheet patterns NS1 are arranged on the first lower pattern BP1 in the third direction D3. The respective first sheet patterns NS1 are spaced apart in the third direction D3. Each of the first sheet patterns NS1 includes an upper surface NS1_US and a lower surface NS1_BS that are opposite to each other in the third direction D3.

A plurality of second sheet patterns NS2 may be disposed on the second lower pattern BP2. The second sheet patterns NS2 may overlap the second lower pattern BP2 in the third direction D3. The second lower pattern BP2 and the plurality of second sheet patterns NS2 may be included in the second active pattern AP2.

The plurality of second sheet patterns NS2 are arranged on the second lower pattern BP2 in the third direction D3. The respective second sheet patterns NS2 are spaced apart in the third direction D3. Each of the second sheet patterns NS2 includes an upper surface NS2_US and a lower surface NS2_BS that are opposite to each other in the third direction D3.

The first sheet patterns NS1 and the second sheet patterns NS2 may be used as a channel region of the transistor.

The first sheet pattern NS1 and the second sheet pattern NS1 may be formed using an active pattern film (e.g., active pattern film ACT of FIG. 27) formed on the substrate 100 using an epitaxial growth method. That is, the first sheet pattern NS1 and the second sheet pattern NS1 may be oriented in the (110) plane like the substrate 100.

For example, each of the upper surface NS1_US of first sheet pattern and the lower surface NS1_BS of the first sheet pattern may have a (110) crystal plane. Each of the upper surface NS2_US of second sheet pattern and the lower surface NS2_BS of the second sheet pattern may have the (110) crystal plane.

Although three first sheet patterns NS1 and three second sheet patterns NS2 are shown as being disposed in the third direction D3, the example is only for convenience of explanation, and the embodiment is not limited thereto. Although each of first sheet patterns NS1 is shown to have the same width in the first direction D1, the embodiment is not limited thereto. Although each of the second sheet patterns NS2 is shown to have the same width in the first direction D1, the embodiment is not limited thereto.

The first sheet pattern NS1 and the second sheet pattern NS2 may each include one of silicon or germanium which is an elemental semiconductor material, a group IV-IV compound semiconductor, or a group III-V compound semiconductor. Each first sheet pattern NS1 may include the same material as the first protruding pattern 110 or may include a different material from the first protruding pattern 110. Each second sheet pattern NS2 may include the same material as the second protruding pattern 210 or may include a different material from the second protruding pattern 210.

In the semiconductor device according to some embodiments, the first sheet pattern NS1 and the second sheet pattern NS2 may each be a silicon sheet pattern including silicon.

The width of the first sheet pattern NS1 in the second direction D2 may increase or decrease in proportion to the width of the upper surface BPT_US of the first lower pattern in the second direction D2. The width of the second sheet pattern NS2 in the second direction D2 may increase or decrease in proportion to the width of the upper surface BP2_US of the second lower pattern in the second direction D2.

Although the first sheet patterns NS1 stacked in the third direction D3 are shown to have the same width in the second direction D2, and the second sheet patterns NS2 stacked in the third direction D3 are shown to have the same width in the second direction D2, the example is only for convenience of explanation, and the embodiment is not limited thereto. Unlike the shown example, the width in the second direction D2 of the first sheet patterns NS1 stacked in the third direction D3 may decrease, as it goes away from the first lower pattern BPT. The above description may, of course, be applied to the second sheet pattern NS2.

Although FIGS. 1 and 3 show that the width of the first lower pattern BPT in the second direction D2 is the same as the width of the second lower pattern BP2 in the second direction D2, the present disclosure is not limited thereto. For reference, the width of the first lower pattern BPT in the second direction D2 may be the width of the upper surface BPT_US of the first lower pattern BPT in the second direction D2.

As an example, the first lower pattern BPT may be disposed directly adjacent to the second lower pattern BP2 in the second direction D2. For example, no additional active pattern may be disposed between the first lower pattern BPT and the second lower pattern BP2.

Unlike the shown example, as another example, one or more active patterns may also be additionally disposed between the first lower pattern BPT and the second lower pattern BP2. As yet another example, the second lower pattern BP2 may be disposed in a region spatially separated from the first lower pattern BP1. In such a case, unlike the first lower pattern BPT, the second lower pattern BP2 may extend lengthwise in the first direction D1.

A field insulating film 105 may be formed on the substrate 100. The field insulating film 105 may be disposed on side walls of the first lower pattern BP1. The field insulating film 105 may be disposed on side walls of the second lower pattern BP2. The field insulating film 105 is not disposed on the upper surface BP1_US of the first lower pattern and the upper surface BP2_US of the second lower pattern.

As an example, the field insulating film 105 may entirely cover the side walls of the first lower pattern BP1 and/or the side walls of the second lower pattern BP2. For example, the field insulating film 105 may contact the side walls of the first lower pattern BP1 and/or the side walls of the second lower pattern BP2. Unlike the shown example, the field insulating film 105 may cover a part of the side walls of the first lower pattern BP1 and a part of the side walls of the second lower pattern BP2. In such a case, a part of the first lower pattern BP1 and/or a part of the second lower pattern BP2 may protrude from the upper surface of the field insulating film 105 in the third direction D3.

A upper surface of the field insulating film 105 may have, but is not limited to, a concave shape. The field insulating film 105 may include, for example, an oxide film, a nitride film, an oxynitride film, or a combination thereof. Although the field insulating film 105 is shown as a single film, the example is only for convenience of explanation and is not limited thereto.

A plurality of gate structures GS may be disposed on the substrate 100. Each gate structure GS may extend lengthwise in the second direction D2. The gate structures GS may be disposed to be spaced apart from one another in the first direction D1. The gate structures GS may be adjacent to each other in the first direction D1.

The gate structures GS are disposed on the first lower pattern BP1 and the second lower pattern BP2. The gate structures GS may intersect the first lower pattern BP1 and the second lower pattern BP2. The gate structures GS may include, for example, a gate electrode 120, a gate insulating film 130, a gate spacer 140, and a gate capping pattern 145.

Although each gate structure GS is shown to be disposed over the first lower pattern BP1 and the second lower pattern BP2, this example is only for convenience of explanation and the embodiment is not limited thereto.

As an example, a part of the gate structure GS may be separated into two portions and disposed on the first lower pattern BP1 and the second lower pattern BP2. That is, the first gate structure on the first lower pattern BP1 may be separated from the second gate structure on the second lower pattern BP2 in the second direction D2. In such a case, the first gate electrode and the first gate insulating film included in the first gate structure may be separated from the second gate electrode and the second gate insulating film included in the second gate structure.

Unlike the shown example, as another example, when the second lower pattern BP2 is disposed in a region spatially separated from the first lower pattern BP1, the first gate structure on the first lower pattern BP1 may be spatially separated from the second gate structure on the second lower pattern BP2. Even in this case, the first gate electrode and the first gate insulating film included in the first gate structure are separated from the second gate electrode and the second gate insulating film included in the second gate structure.

The plurality of gate structures GS may include normal gate structures GS_11, GS_12, and GS_13, and an edge gate structure GS_2. The edge gate structure GS_2 may be disposed at the end of the first lower pattern BP1 and/or the end of the second lower pattern BP2. For example, the edge gate structures GS_2 may be disposed at the end of the first lower pattern BP1 and the end of the second lower pattern BP2.

The normal gate structures GS_11, GS_12, and GS_13 are disposed between the edge gate structures GS_2. The normal gate structures GS_11, GS_12, and GS_13 are disposed to be spaced apart from each other in the first direction D1. The normal gate structures GS_11, GS_12, and GS_13 may include a first normal gate structure GS_11, a second normal gate structure GS_12, and a third normal gate structure GS_13. Although three normal gate structures GS_11, GS_12, and GS_13 are shown, the example is only for convenience of explanation, and the embodiment is not limited thereto.

In FIG. 2, the plurality of gate structures GS may include an inner gate structure INT_GS. The inner gate structure INT_GS may include a gate electrode 120 and a gate insulating film 130.

The inner gate structure INT_GS may be disposed between the first sheet patterns NS1 adjacent to each other in the third direction D3. The inner gate structure INT_GS may be disposed between the first lower pattern BP1 and the first sheet pattern NS1. The inner gate structure INT_GS may be disposed between each of the first sheet patterns NS1 adjacent to each other in the third direction D3.

The inner gate structure INT_GS may be in contact with the upper surface BP1_US of the first lower pattern, the upper surface NS1_US of the first sheet pattern, and the lower surface NS1_BS of the first sheet pattern. The inner gate structure INT_GS may be in contact with the upper surface 115US of the first capping pattern 115. The gate insulating film 130 included in the inner gate structure INT_GS may be in contact with the upper surface 115US of the first capping pattern 115.

Although not shown, an inner gate structure may be disposed between the second sheet patterns NS2 adjacent to each other in the third direction D3. Also, the inner gate structure may be disposed between the second lower pattern BP2 and the second sheet pattern NS2.

For example, from the viewpoint of a cross-sectional view taken in the first direction D1, the entire gate electrodes 120 included in the edge gate structure GS_2 may overlap the first sheet pattern NST in the third direction D3, but embodiments are not limited thereto.

Figure 29:
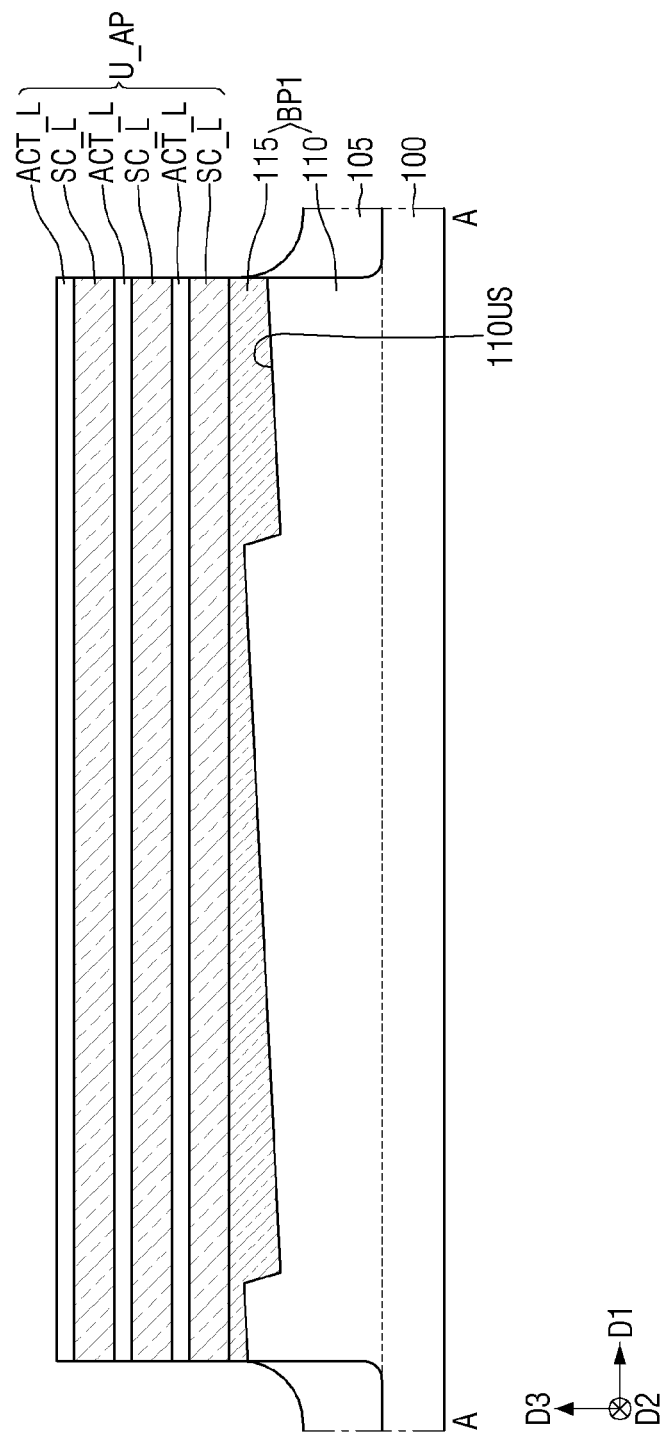

When the upper surfaces 110US of the first protruding pattern 110 in the portion that overlaps the gate structure GS are connected, a connecting line that connects the upper surfaces 110US of the first protruding patterns 110 may have a sawtooth shape, like the upper surface 110US of the first protruding patterns 110 of FIG. 29.

Since the connecting line that connects the upper surfaces 110US of the first protruding patterns 110 has a sawtooth-like shape, the thickness of the first capping pattern 115 in the portion that overlaps the gate structure GS may vary for each position.

Hereinafter, although the thicknesses of the first capping pattern 115 at the portion that overlaps the normal gate structures GS_11, GS_12, and GS_13 are compared, the embodiment is not limited thereto. For example, the thickness of the first capping pattern 115 at the portion that overlaps the normal gate structures GS_11, GS_12, and GS_13 may be compared with the thickness of the first capping pattern 115 at the portion that overlaps the edge gate structure GS_2.

In FIGS. 2, 4, and 5, a thickness t1 of the first capping pattern 115 at the portion that overlaps the first normal gate structure GS_11 is different from a thickness t2 of the first capping pattern 115 at the portion that overlaps the second normal gate structure GS_12. The thickness t1 of the first capping pattern 115 at the portion that overlaps the first normal gate structure GS_11 is shown as being greater than the thickness t2 of the first capping pattern 115 at the portion that overlaps the second normal gate structure GS_12, the embodiment is not limited thereto.

A depth d1 from the lower surface NS1_BS of the first sheet pattern to the upper surface 110US of the first protruding pattern at the portion that overlaps the first normal gate structure GS_11 is different from a depth d2 from the lower surface NST_BS of the first sheet pattern to the upper surface 110US of the first protruding pattern at the portion that overlaps the second normal gate structure GS_12.

On the other hand, a thickness (d1-t1) of the lowermost inner gate structure INT_GS included in the first normal gate structure GS_11 may be the same as a thickness (d2-t2) of the lowermost inner gate structure INT_GS included in the second normal gate structure GS_12.

Here, the meaning of the "same thickness" includes not only a case where the two positions to be compared have exactly the same thickness, but also includes a minute difference in thickness that may occur due to process margins occurring in the manufacturing process.

Each of the first sheet patterns NS1 may include a first terminating end and a second terminating end spaced apart from each other in the first direction D1. The first and second terminating ends may be opposite ends of the same first sheet pattern NS1. For example, in FIG. 4, the thickness t1 of the first capping pattern 115 may be measured halfway between the first terminating end of the first sheet pattern NS1 and the second terminating end of the first sheet pattern NS1. Also, a depth d1 from the lower surface NST_BS of the first sheet pattern to the upper surface 110US of the first protruding pattern may be measured halfway between the first terminating end of the first sheet pattern NS1 and the second terminating end of the first sheet pattern NS1.

In FIGS. 2, 5, and 6, the thickness t2 of the first capping pattern 115 at the portion that overlaps the second normal gate structure GS_12 may be different from the thickness t3 of the first capping pattern 115 at the portion that overlaps the third normal gate structure GS_13.

A depth d2 from the lower surface NS1_BS of the first sheet pattern to the upper surface 110US of the first protruding pattern at the portion that overlaps the second normal gate structure GS_12 may be different from a depth d3 from the lower surface NST_BS of the first sheet pattern to the upper surface 110US of the first protruding pattern at the portion that overlaps the third normal gate structure GS_13.

On the other hand, a thickness (d2-t2) of the lowermost inner gate structure INT_GS included in the second normal gate structure GS_12 may be the same as a thickness (d3-t3) of the lowermost inner gate structure INT_GS included in the third normal gate structure GS_13.

As shown in FIG. 6, a slope of the lower surface 115BS of the first capping pattern may change abruptly at the portion that overlaps the third normal gate structure GS_13. Alternatively, the first capping pattern 115 may include a first portion 115_R1 and a second portion 115_R2 at the portion that overlaps the third normal gate structure GS_13. When the lower surface 115BS of the first capping pattern has a positive slope in the first portion 115_R1 of the first capping pattern, the lower surface 115BS of the first capping pattern may have a negative slope in the second portion 115_R2 of the first capping pattern.

When a thickness t3 of the first capping pattern 115 at the portion that overlaps the third normal gate structure GS_13 is measured at the second portion 115_R2 of the first capping pattern, the thickness t2 of the first capping pattern 115 at the portion that overlaps the second normal gate structure GS_12 may be the same as the thickness t3 of the first capping pattern 115 at the portion that overlaps the third normal gate structure GS_13.

Although the lower surface 115BS of the first capping pattern at the second portion 115_R2 of the first capping pattern is shown to be a plane that is inclined toward the substrate 100, the embodiment is not limited thereto. Unlike the shown example, the lower surface 115BS of the first capping pattern at the second portion 115_R2 of the first capping pattern may have a stepped shape that is inclined toward the substrate 100.

When the thickness of the first capping pattern 115 changes in the cross-sectional view taken in the first direction D1, the thickness of the first capping pattern 115 may be the same as the thickness of the second capping pattern 215 in the cross-sectional view taken in the second direction D2 as shown in FIG. 3.

The gate electrode 120 is disposed on the first lower pattern BPT and the second lower pattern BP2. The gate electrode 120 intersects the first lower pattern BPT and the second lower pattern BP2. The gate electrode 120 may wrap the first sheet pattern NS1. The gate electrode 120 may wrap the second sheet pattern NS2. For example, the gate electrode 120 may surround the first and second sheet patterns NS1 and NS2.

The gate electrode 120 may each include at least one of metal, metal alloy, conductive metal nitride, metal silicide, doped semiconductor material, conductive metal oxide, and conductive metal oxynitride. The gate electrode 120 may include, but not be limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and conductive metal oxynitride may include, but not be limited to, oxidized forms of the aforementioned materials.

The gate electrode 120 may be disposed on both sides of a first source/drain pattern 150, which will be described below. The gate structure GS may be disposed on both sides of the first source/drain pattern 150 in the first direction D1. The gate electrode 120 may be disposed on both sides of a second source/drain pattern 250, which will be described below. The gate structure GS may be disposed on both sides of the second source/drain pattern 250 in the first direction D1.

The gate insulating film 130 may extend along the upper surface of the field insulating film 105, the upper surface BPT_US of the first lower pattern, and the upper surface BP2_US of the second lower pattern. The gate insulating film 130 may be in contact with the upper surface BPT_US of the first lower pattern and the upper surface BP2_US of the second lower pattern. For example, the gate insulating film 130 may be in contact with the upper surface 115US of the first capping pattern 115 and the upper surface 215US of the second capping pattern 215.

The gate insulating film 130 may wrap the first sheet pattern NST and the second sheet pattern NS2. For example, the gate insulating film 130 may surround the first and second sheet patterns NS1 and NS2. The gate insulating film 130 may be disposed along the periphery of the first sheet pattern NS1 and the periphery of the second sheet pattern NS2. The gate electrode 120 is disposed on the gate insulating film 130. The gate insulating film 130 is disposed between the gate electrode 120 and the first sheet pattern NS1. The gate insulating film 130 is disposed between the gate electrode 120 and the second sheet pattern NS2.

The gate insulating film 130 may include silicon oxide, silicon-germanium oxide, germanium oxide, silicon oxynitride, silicon nitride, or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the gate insulating film 130 is shown as a single film, this example is only for convenience of explanation and the embodiment is not limited thereto. The gate insulating film 130 may include multiple films. The gate insulating film 130 may include an interfacial layer and a high dielectric constant insulating film disposed between the first sheet pattern NS1 and the gate electrode 120, and between the second sheet pattern NS2 and the gate electrode 120.

The semiconductor device according to some embodiments may include an NC (Negative Capacitance) FET that uses a negative capacitor. For example, the gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but not be limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but not be limited to, 0.5 to 10 nm. Since a critical thickness that exhibits the ferroelectric properties may vary for each ferroelectric material, the thickness of the ferroelectric material film may vary depending on the ferroelectric material.

As an example, the gate insulating film 130 may include a single ferroelectric material film. As another example, the gate insulating film 130 may include a plurality of ferroelectric material films spaced apart from each other. The gate insulating film 130 may have a stacked film structure in which the plurality of ferroelectric material films and the plurality of paraelectric material films are alternately stacked.

The gate spacer 140 may be disposed on the side wall of the gate electrode 120. For example, with reference to FIG. 2, the gate spacers 140 may contact side surfaces of the gate insulating film 130 and side surfaces of the first sheet patterns NS1 of the edge gate structures GS_2. The gate spacer 140 may not be disposed between the first sheet patterns NS1 adjacent to each other in the third direction D3. Although not shown, the gate spacer 140 may not be disposed between the second sheet patterns NS2 adjacent to each other in the third direction D3.

The gate spacer 140 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. Although the gate spacer 140 is shown to be a single film, this example is only for convenience of explanation and is not limited thereto.

A gate capping pattern 145 may be disposed on the gate electrode 120 and the gate spacer 140. For example, a lower surface of the gate capping pattern 145 may contact upper surfaces of the gate electrode 120, the gate insulating film 130, and the gate spacer 140. An upper surface of the gate capping pattern 145 may be disposed on the same plane as an upper surface of the first interlayer insulating film 190. For example, upper surfaces of the gate capping pattern 145 and the first interlayer insulating film 190 may be coplanar with one another. The gate capping pattern 145 may be disposed between the gate spacers 140, unlike the shown example.

The gate capping pattern 145 may include, for example, at least one of silicon nitride (SiN), silicon oxynitride (SiON), silicon carbonitride (SiCN), silicon oxycarbonitride (SiOCN), and combinations thereof. The gate capping pattern 145 may include a material having an etch selectivity with respect to the first interlayer insulating film 190.

A first source/drain pattern 150 may be disposed on the first lower pattern BP1. The first source/drain pattern 150 is connected to the first sheet pattern NS1.

For example, the first source/drain pattern 150 may separate the first capping patterns 115. The first source/drain pattern 150 may be in contact with the first capping pattern 115 and the first protruding pattern 110.

The first source/drain pattern 150 may be disposed on the side surface of the gate structure GS. The first source/drain patterns 150 may be disposed between gate structures GS adjacent to each other in the first direction D1.

A first source/drain pattern 150 may be disposed inside the source/drain recess 150R. The source/drain recess 150R extends lengthwise in the third direction D3. The source/drain recess 150R may be defined between the gate structures GS adjacent to each other in the first direction D1.

A bottom surface of the source/drain recess 150R may be defined by the first lower pattern BP1. The bottom surface of the source/drain recess 150R may be lower than the upper surface BP1_US of the first lower pattern BP1. Since the first source/drain pattern 150 separates the first capping pattern 115, the bottom surface of the source/drain recess 150R may be defined by the first capping pattern 115 and the first protruding pattern 110.

In the semiconductor device according to some example embodiments, side walls of the source/drain recesses 150R may be defined by the first sheet pattern NS1 and the inner gate structure INT_GS. The inner gate structure INT_GS may include an upper surface which faces the lower surface NS1_BS of the first sheet pattern. The inner gate structure INT_GS includes a lower surface which faces the upper surface NS1_US of the first sheet pattern or the upper surface BP1_US of the first lower pattern. The inner gate structure INT_GS includes side walls that connect the upper surface of the inner gate structure INT_GS and the lower surface of the inner gate structure INT_GS. The side walls of the inner gate structure INT_GS may define a part of the side walls of the source/drain recess 150R.

The first source/drain pattern 150 is in contact with the first sheet pattern NS1. Since the gate spacer 140 is not disposed between the adjacent first sheet patterns NS1, the inner gate structure INT_GS may be in contact with the first source/drain pattern 150. The gate insulating film 130 of the inner gate structure INT_GS may be in contact with the first source/drain pattern 150.

Although not shown, the second source/drain pattern 250 may be disposed on the second lower pattern BP2. The second source/drain pattern 250 is connected to the second sheet pattern NS2. The second source/drain pattern 250 may be disposed on the side surfaces of the gate structure GS. The second source/drain pattern 250 may be disposed between the gate structures GS adjacent to each other in the first direction D1.

The first source/drain pattern 150 and the second source/drain pattern 250 may be included in the source/drain of the transistor that uses the first sheet pattern NS1 and the second sheet pattern NS2 as channel regions.

The first source/drain pattern 150 and the second source/drain pattern 250 include a semiconductor material. The first source/drain pattern 150 and the second source/drain pattern 250 include an epitaxial semiconductor pattern.

The first source/drain pattern 150 and the second source/drain pattern 250 may each include, for example, at least one of silicon, silicon-germanium, and silicon carbide.

As an example, the first source/drain pattern 150 may include doped n-type impurities. For example, the n-type impurities may include at least one of phosphorus (P), arsenic (As), antimony (Sb), and bismuth (Bi). As another example, the first source/drain pattern 150 may include doped p-type impurities. For example, the p-type impurities may be, but not be limited to, boron (B). Although the first source/drain pattern 150 is shown as a single film, the example is only for convenience of explanation and the embodiment is not limited thereto.

Although not shown, the second source/drain pattern 250 may include doped n-type impurities. Alternatively, the second source/drain pattern 250 may include doped p-type impurities. For example, when the first source/drain pattern 150 includes doped n-type impurities, the second source/drain pattern 250 may include doped p-type impurities. As another example, when the first source/drain pattern 150 includes doped p-type impurities, the second source/drain pattern 250 may include doped n-type impurities.

Although not shown, a source/drain etching stop film may be disposed on the upper surface of the first source/drain pattern 150 and the upper surface of the second source/drain pattern 250. The source/drain etching stop film may be disposed on the upper surface of the field insulating film 105.

A first interlayer insulating film 190 may be disposed on the first source/drain pattern 150 and the second source/drain pattern 250. For example, a lower surface of the first interlayer insulating film 190 may contact upper surfaces of the first source/drain pattern 150 and the second source/drain pattern 250. The first interlayer insulating film 190 may not cover the upper surface of the gate capping pattern 145.

The first interlayer insulating film 190 may include, for example, at least one of silicon oxide, silicon nitride, silicon oxynitride and a low dielectric constant material. The low dielectric constant material may include, but not limited to, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

The first source/drain contact 180 is disposed on the first source/drain pattern 150. The first source/drain contact 180 is connected to the first source/drain pattern 150. The first source/drain contact 180 passes through the first interlayer insulating film 190, and may be connected to the first source/drain pattern 150. In example embodiments, upper surfaces of the first source/drain contact 180 and the first interlayer insulating film 190 may be coplanar.

Although not shown, a second source/drain contact is disposed on the second source/drain pattern 250. The second source/drain contact is connected to the second source/drain pattern 250. The second source/drain contact passes through the first interlayer insulating film 190, and may be connected to the second source/drain pattern 250. In example, embodiments, upper surfaces of the second source/drain contact and the first interlayer insulating film 190 may be coplanar.

A first contact silicide film 155 may be further disposed between the first source/drain contact 180 and the first source/drain pattern 150. The first contact silicide film 155 may separate the first source/drain contact 180 from the first source/drain pattern 150. The first contact silicide film 155 may contact bottom and side surfaces of the first source/drain contact 180. Upper surfaces of the first contact silicide film 155 and the first source/drain pattern 150 may be coplanar with one another.

Although not shown, a second contact silicide film may be further disposed between the second source/drain contact and the second source/drain pattern 250. The second contact silicide film may separate the second source/drain contact from the second source/drain pattern 250. The second contact silicide film may contact bottom and side surfaces of the second source/drain contact. Upper surfaces of the second contact silicide film and the second source/drain pattern 250 may be coplanar with one another.

Although the first source/drain contact 180 is shown to be a single film, the example is only for convenience of explanation and the embodiment is not limited thereto. The first source/drain contact 180 may include, for example, at least one of a metal, a metal alloy, conductive metal nitride, conductive metal carbide, conductive metal oxide, conductive metal carbonitride, and a two-dimensional (2D) material. The first contact silicide film 155 may include a metal silicide material.

A second interlayer insulating film 191 is disposed on the first interlayer insulating film 190. A lower surface of the second interlayer insulating film 191 may contact an upper surface of the first interlayer insulating film 190. The second interlayer insulating film 191 may include, for example, at least one of silicon oxide, silicon nitride, silicon oxynitride, and a low dielectric constant material.

The wiring structure 205 is disposed inside the second interlayer insulating film 191. The wiring structure 205 may be connected to the first source/drain contact 180. The wiring structure 205 may include a wiring line 207 and a wiring via 206.

Although the wiring line 207 and the wiring via 206 are shown to be distinguished from each other, this example is only for convenience of explanation, and is not limited thereto. That is, as an example, the wiring line 207 may be formed after the wiring via 206 is formed. As another example, the wiring via 206 and the wiring line 207 may be formed at the same time.

Although the wiring line 207 and the wiring via 206 are each shown as a single film, this example is only for convenience of explanation and is not limited thereto. The wiring line 207 and the wiring via 206 may each include, for example, at least one of a metal, a metal alloy, conductive metal nitride, conductive metal carbide, conductive metal oxide, conductive metal carbonitride, and a two-dimensional (2D) material.

For example, an upper surface of the first source/drain contact 180 of the portion connected to the wiring structure 205 may be disposed on the same plane as an upper surface of the first source/drain contact 180 of the portion not connected to the wiring structure 205.

Figure 7:
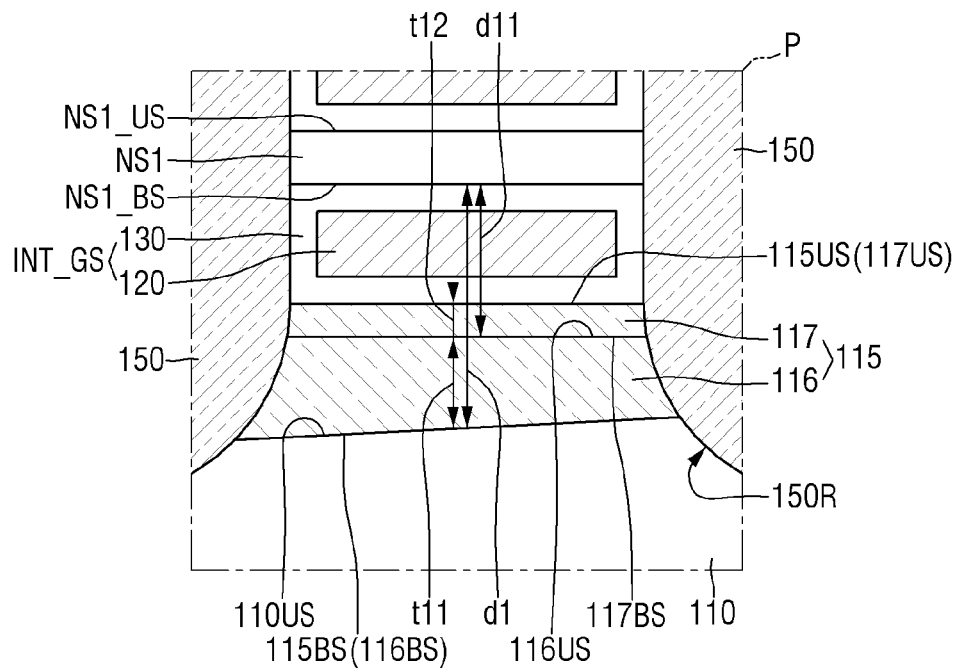
FIGS. 7 to 9 are diagrams for explaining a semiconductor device according to example embodiments.
Figure 8:
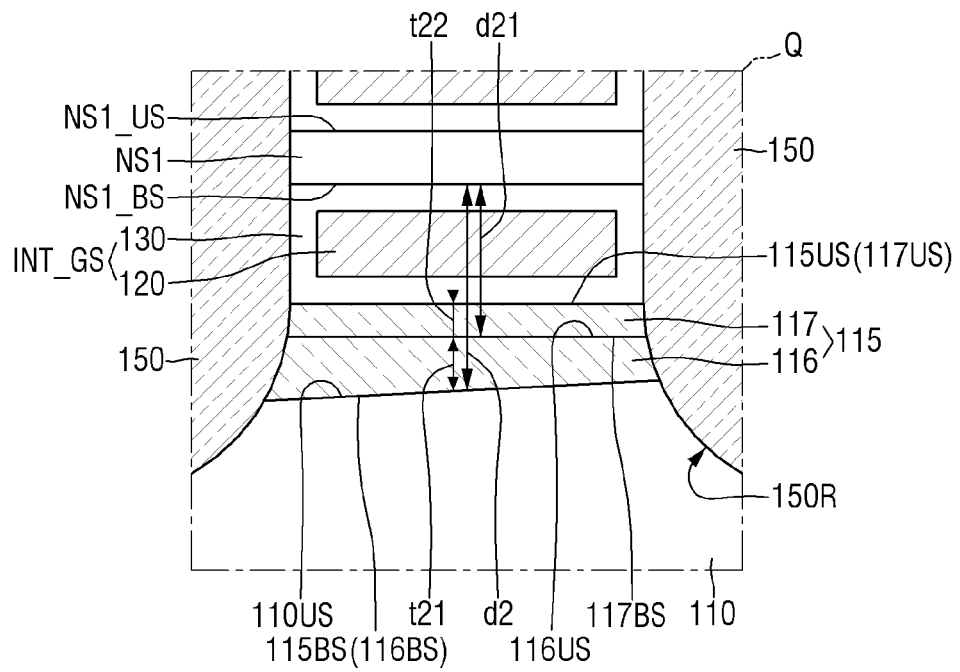
Figure 9:
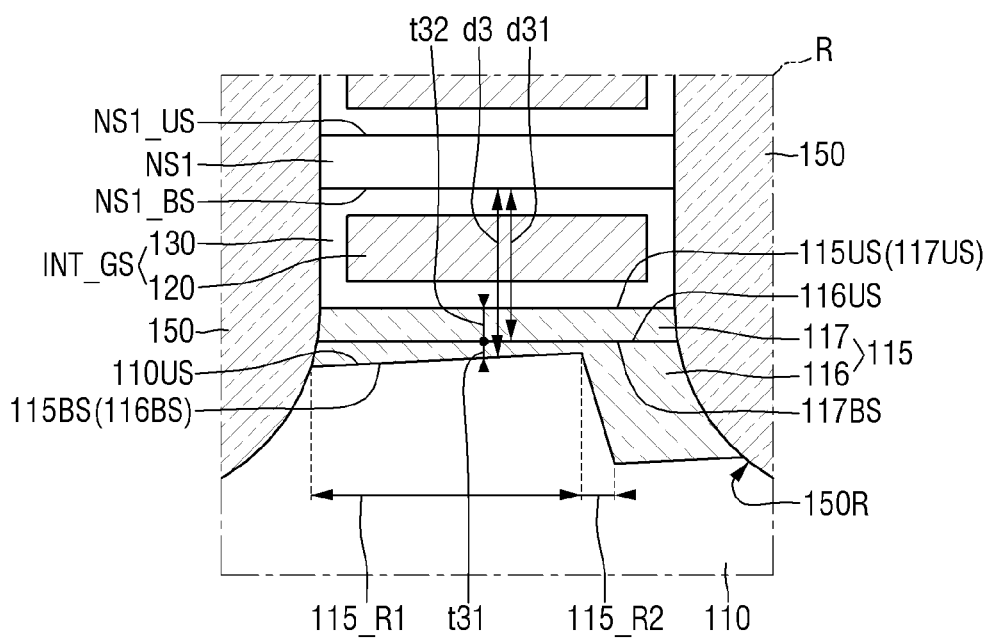

FIGS. 7 to 9 are diagrams for explaining a semiconductor device according to example embodiments. For convenience of explanation, the explanation will be provided mainly on the points that are different from those explained using FIGS. 1 to 6.

For reference, FIGS. 7 to 9 are enlarged views of a portion P, a portion Q, and a portion R of FIG. 2.

Referring to FIGS. 2 and 7 to 9, in the semiconductor device according to example embodiments, the first capping pattern 115 may include a first lower capping pattern 116 and a first upper capping pattern 117.

The first capping pattern 115 may include a first lower capping pattern 116 and a first upper capping pattern 117 that are sequentially disposed on the first protruding pattern 110. The first lower capping pattern 116 is in contact with the first protruding pattern 110. The first lower capping pattern 116 is disposed between the first protruding pattern 110 and the first upper capping pattern 117.

The first lower capping pattern 116 includes an upper surface 116US and a lower surface 116BS that are opposite to each other in the third direction D3. The first upper capping pattern 117 includes an upper surface 117US and a lower surface 117BS that are opposite to each other in the third direction D3.

The lower surface 116BS of the first lower capping pattern may be the lower surface 115BS of the first capping pattern. The upper surface 117US of the first upper capping pattern may be the upper surface 115US of the first capping pattern. The upper surface 116US of the first lower capping pattern faces the lower surface 117BS of the first upper capping pattern. For example, the upper surface 116US of the first lower capping pattern may be in contact with the lower surface 117BS of the first upper capping pattern.

The first lower capping pattern 116 includes a different material from the first upper capping pattern 117. The first lower capping pattern 116 may include, for example, one of an undoped silicon film, a silicon germanium film, and a carbon-doped silicon film. The first upper capping pattern 117 may include, for example, one of an undoped silicon film, a silicon germanium film, and a carbon-doped silicon film.

Although not shown, the second capping pattern (e.g., second capping pattern 215 of FIG. 3) also includes a lower capping pattern and an upper capping pattern.

In FIGS. 2, 7, and 8, a thickness t11 of the first lower capping pattern 116 at the portion that overlaps the first normal gate structure GS_11 is different from a thickness t21 of the first lower capping pattern 116 at the portion that overlaps the second normal gate structure GS_12.

A thickness t12 of the first upper capping pattern 117 at the portion that overlaps the first normal gate structure GS_11 may be the same as a thickness t22 of the first upper capping pattern 117 at the portion that overlaps the second normal gate structure GS_12.

A depth dll from the lower surface NST_BS of the first sheet pattern to the upper surface 116US of the first lower capping pattern at the portion that overlaps the first normal gate structure GS_11 may be the same as a depth d21 from the lower surface NS1_BS of the first sheet pattern to the upper surface 116US of the first lower capping pattern at the portion that overlaps the second normal gate structure GS_12.

A difference in thickness of the first capping pattern 115 at different portions from each other may be a difference in thicknesses of the first lower capping pattern 116. In example embodiments, a thickness of the first upper capping pattern 117 in the third direction D3 may be uniform. For example, a thickness of the first upper capping pattern 117 in the third direction D3 may be constant in a cross-sectional view taken along the first direction D1.

In FIGS. 2, 8, and 9, the thickness t21 of the first lower capping pattern 116 at the portion that overlaps the second normal gate structure GS_12 may be different from a thickness t31 of the first lower capping pattern 116 at the portion that overlaps the third normal gate structure GS_13.

The thickness t22 of the first upper capping pattern 117 at the portion that overlaps the second normal gate structure GS_12 may be the same as a thickness t32 of the first upper capping pattern 117 at the portion that overlaps the third normal gate structure GS_13.

A depth d21 from the lower surface NST_BS of the first sheet pattern to the upper surface 116US of the first lower capping pattern at the portion that overlaps the second normal gate structure GS_12 may be the same as a depth d31 from the lower surface NS1_BS of the first sheet pattern to the upper surface 116US of the first lower capping pattern at the portion that overlaps the third normal gate structure GS_13.

FIGS. 10 to 13 are diagrams for explaining a semiconductor device according to example embodiments, respectively. For convenience of explanation, the explanation will be provided mainly on the points that are different from those explained using FIGS. 1 to 6.

Figure 10:
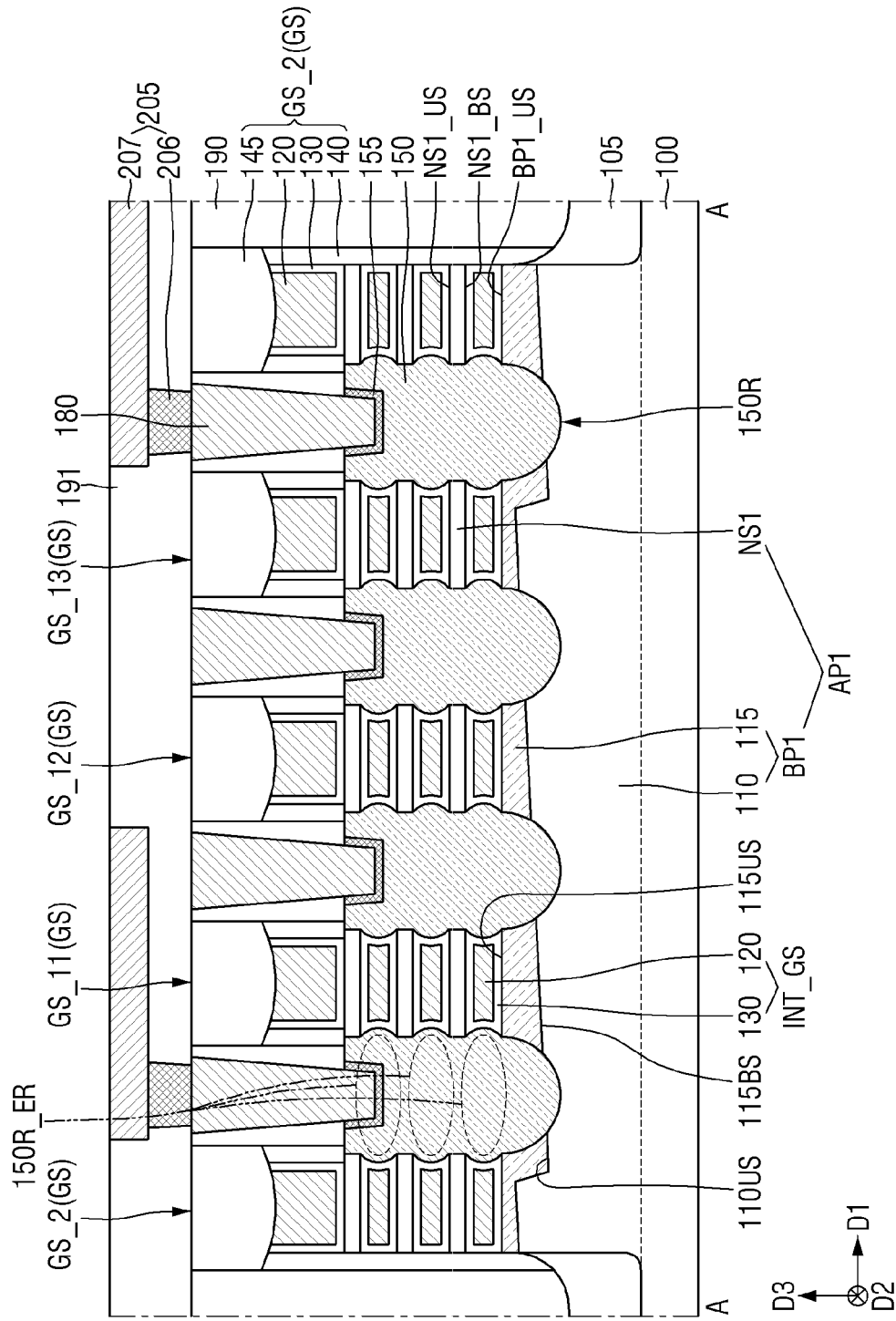
FIGS. 10 to 13 are diagrams for explaining a semiconductor device according to example embodiments, respectively.

Referring to FIG. 10, in a semiconductor device according to example embodiments, a source/drain recess 150R may include a plurality of width extension regions 150R_ER.

Each width extension region 150R_ER may be defined above the upper surface BPT_US of the first lower pattern.

The width extension region 150R_ER may be defined between the first sheet patterns NS1 adjacent to each other in the third direction D3. The width extension region 150R_ER may be defined between the first lower pattern BPT and the first sheet pattern NS1. The width extension region 150R_ER may extend between the first sheet patterns NS1 adjacent to each other in the third direction D3. The width extension region 150R_ER may be defined between the inner gate structures INT_GS adjacent to each other in the first direction D1.

Each width extension region 150R_ER may include a portion whose width in the first direction D1 increases and a portion whose width in the first direction D1 decreases, as it goes away from the upper surface BP1_US of the first lower pattern. For example, the width of the width extension region 150R_ER may increase and then decrease, as it moves away from the upper surface BP1_US of the first lower pattern.

In each width extension region 150R_ER, a point on which the width extension region 150R_ER has the maximum width is located between the first lower pattern BP1 and the first sheet pattern NS1, or between the first sheet patterns NS1 adjacent to each other in the third direction D3.

Although not shown, as an example, the source/drain recess in which the second source/drain pattern (e.g., second source/drain pattern 250 of FIG. 1) is disposed may include a plurality of width extension regions. When the source/drain recess includes the width extension regions, the description thereof may be similar to that of the width extension region 150R_ER described above.

Unlike the shown example, only one of the first source/drain pattern 150 and the second source/drain pattern (e.g., second source/drain pattern 250 of FIG. 1) may be disposed inside the source/drain recess including the width extension regions.

Figure 11:
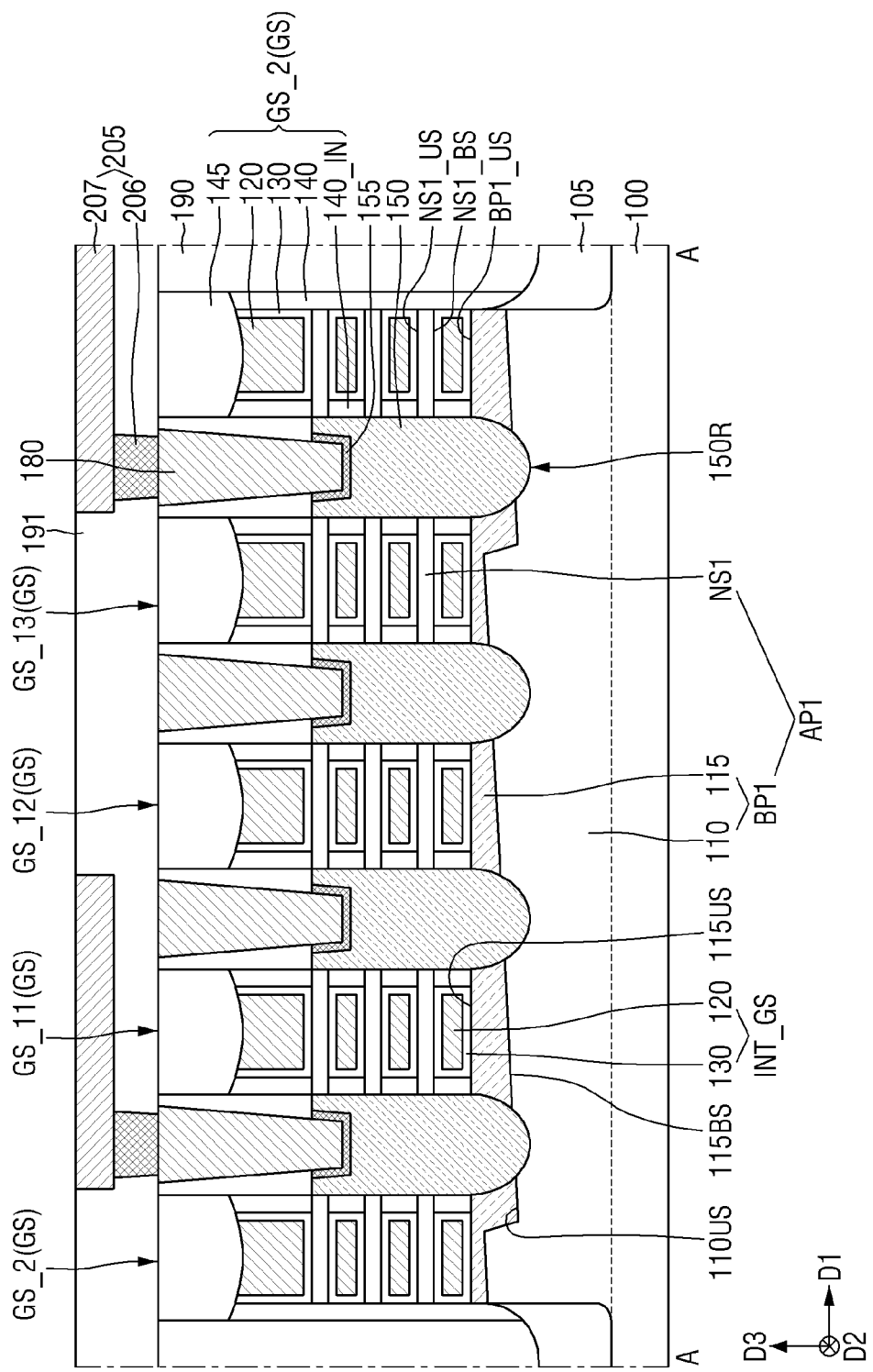

Referring to FIG. 11, in the semiconductor device according to example embodiments, the gate structure GS may further include a plurality of inner spacers 140_IN disposed between the first sheet patterns NS1 adjacent to each other in the third direction D3.

The plurality of inner spacers 140_IN may be disposed between the first sheet patterns NS1 adjacent to each other in the third direction D3, and between the first lower pattern BP1 and the first sheet pattern NS1. The inner spacer 140_IN may be disposed between the upper surface BP1_US of the first lower pattern and the lower surface NS1_BS of the first sheet pattern, and between the upper surface NS1_US of the first sheet pattern and the lower surface NS1_BS of the first sheet pattern that face each other in the third direction D3.

The inner spacer 140_IN is disposed between the inner gate structure INT_GS and the first source/drain pattern 150. Since the inner spacer 140_IN is disposed between the inner gate structure INT_GS and the first source/drain pattern 150, the inner gate structure INT_GS is not in contact with the first source/drain pattern 150. The side walls of the source/drain recess 150R may be defined by the first sheet pattern NS1 and the inner spacers 140_IN.

The inner spacer 140_IN may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

For example, no inner spacer may be disposed between the second sheet patterns (e.g., second sheet patterns NS2 of FIG. 1) adjacent to each other in the third direction D3, and between the second lower pattern BP2 and the second sheet pattern NS2.

Figure 12:
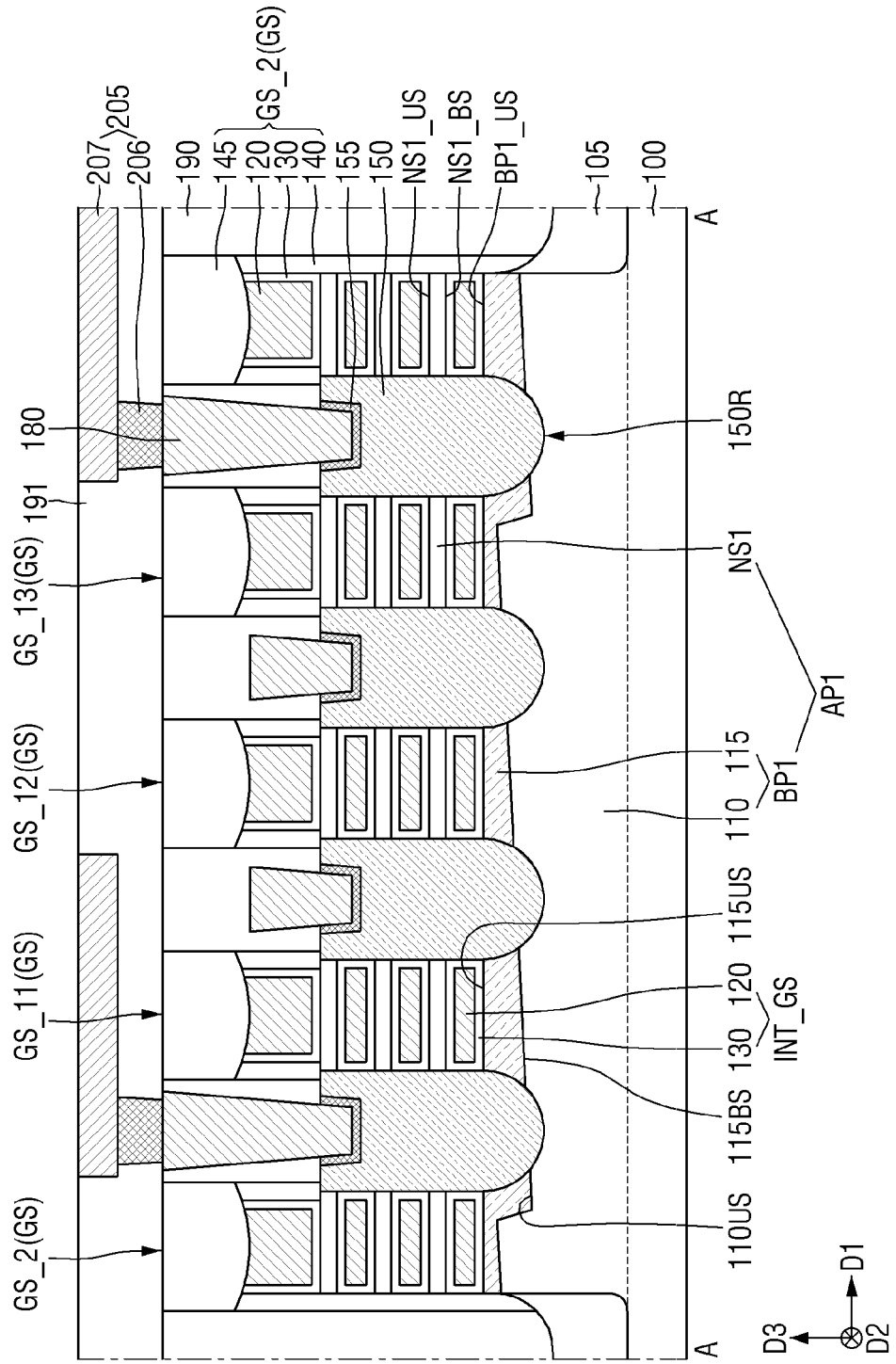

Referring to FIG. 12, in the semiconductor device according to example embodiments, the upper surface of the first source/drain contact 180 of the portion not connected to the wiring structure 205 is lower than the upper surface of the gate capping pattern 145.

The upper surface of the first source/drain contact 180 of the portion connected to the wiring structure 205 is lower than the upper surface of the first source/drain contact 180 of the portion not connected to the wiring structure 205. For example, the upper surface of the first source/drain contact 180 of the portion connected to the wiring structure 205 may be covered by the first interlayer insulating film 190, and a lower surface of the first interlayer insulating film 190 may contact the upper surface of the first source/drain contact 180.

Figure 13:
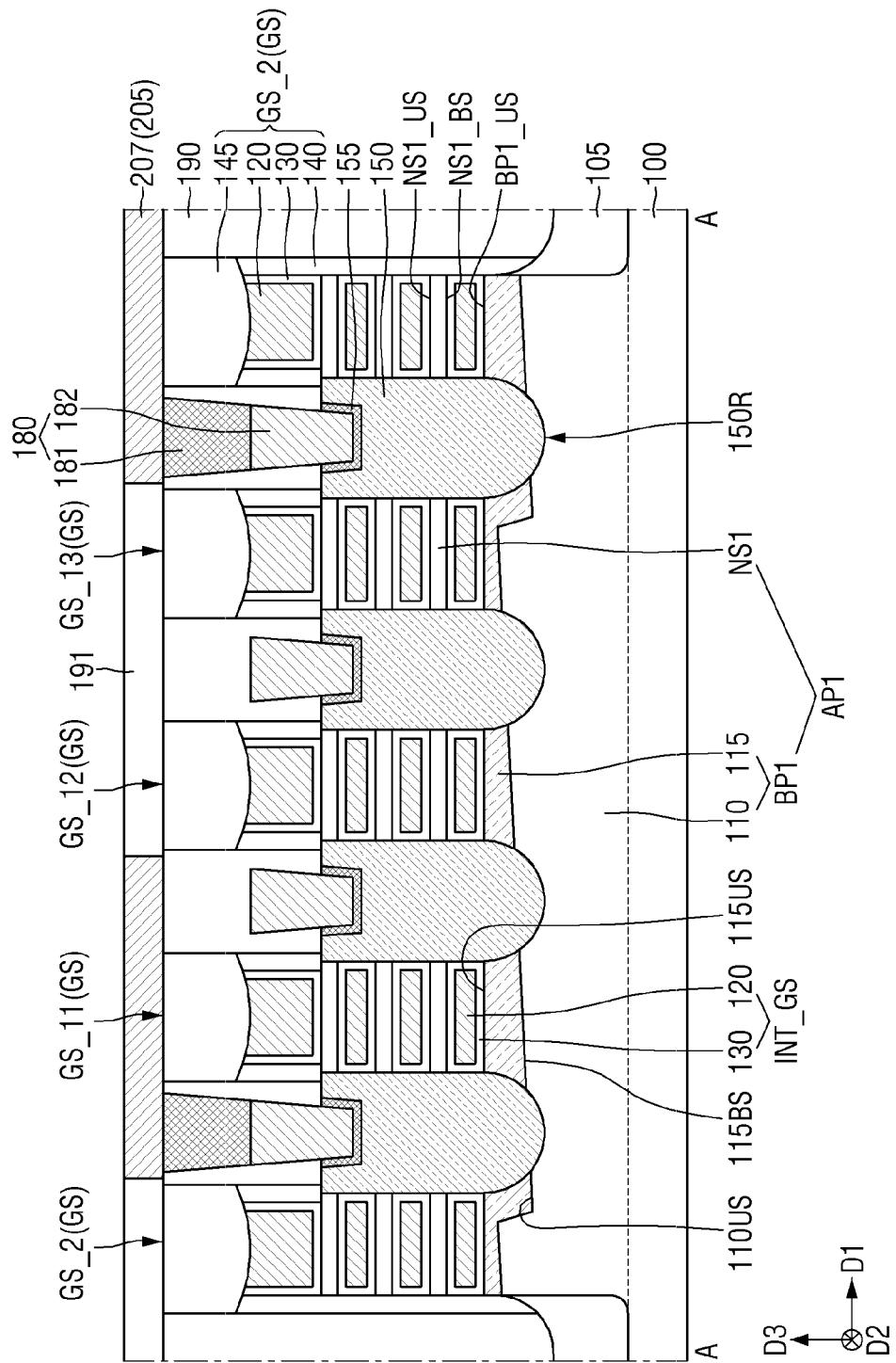

Referring to FIG. 13, in the semiconductor device according to example embodiments, the first source/drain contact 180 includes a lower source/drain contact 181 and an upper source/drain contact 182.

The upper source/drain contact 182 may be disposed in the portion connected to the wiring structure 205. For example, the upper surface of the lower source/drain contact 181 may be covered by the upper source/drain contact 182, and a lower surface of the lower source/drain contact 181 may contact the upper surface of the upper source/drain contact 182. On the other hand, the upper source/drain contact 182 may not be disposed in the portion not connected to the wiring structure 205.

The wiring line 207 may be connected to the first source/drain contact 180 without a wiring via (e.g., wiring via 206 of FIG. 2). The wiring structure 205 may not include the wiring via (e.g., wiring via 206 of FIG. 2).

Although each of the lower source/drain contact 181 and the upper source/drain contact 182 is shown as a single film, the example is only for convenience of explanation and is not limited thereto. The lower source/drain contact 181 and the upper source/drain contact 182 may include, for example, at least one of a metal, a metal alloy, conductive metal nitride, conductive metal carbide, conductive metal oxide, conductive metal carbonitride, and a two-dimensional (2D) material.

FIGS. 14 to 17 are diagrams for explaining a semiconductor device according to example embodiments. For convenience of explanation, the explanation will be provided mainly on the points that are different from those explained using FIGS. 1 to 6.

Figure 14:
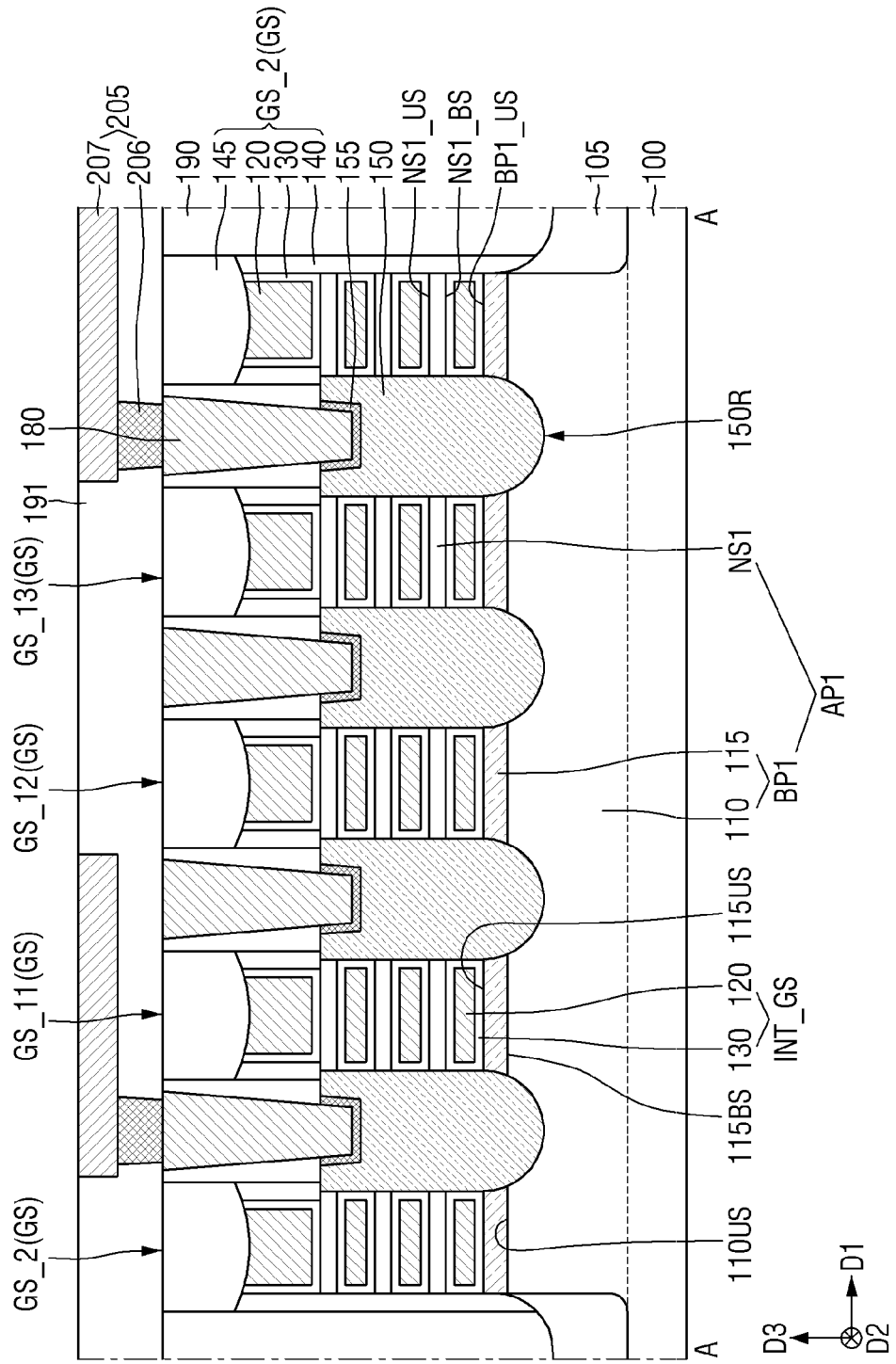
FIGS. 14 to 17 are diagrams for explaining a semiconductor device according to example embodiments.
Figure 15:
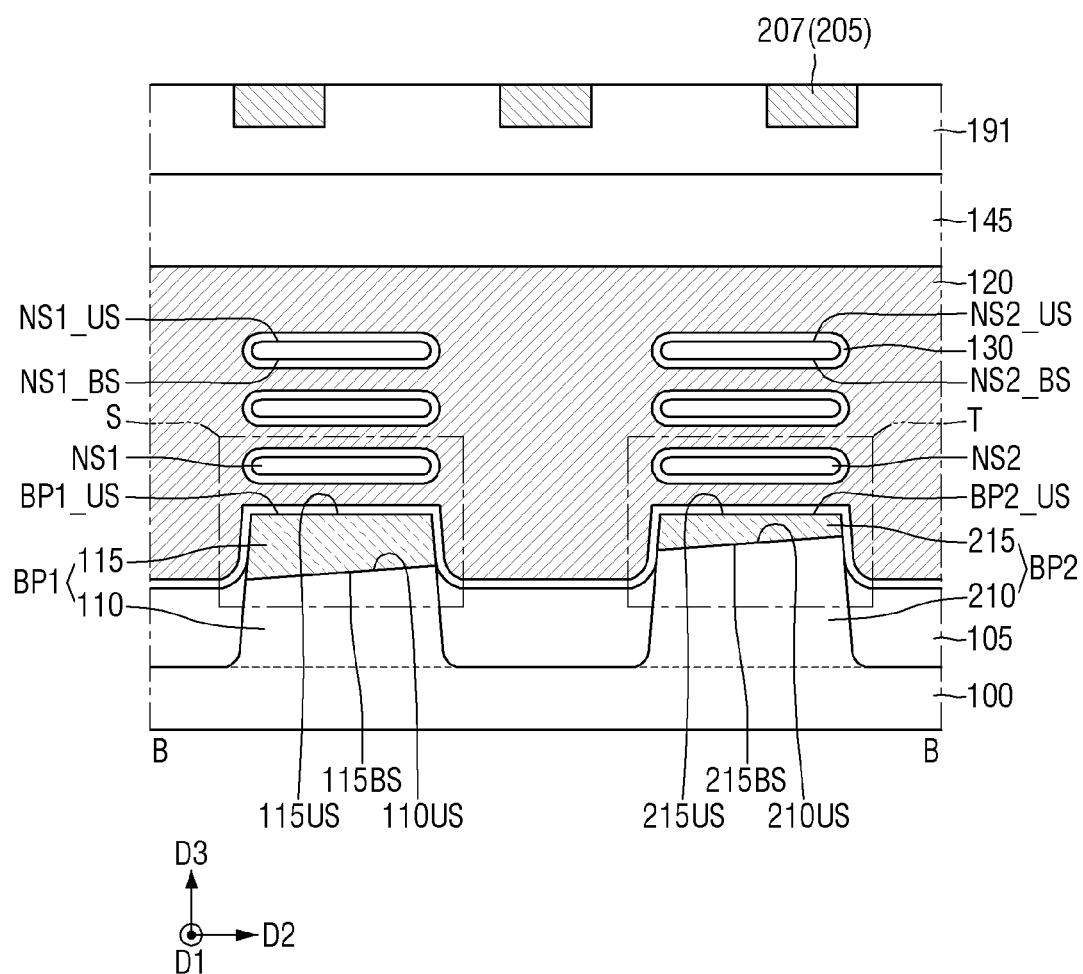
Figure 16:
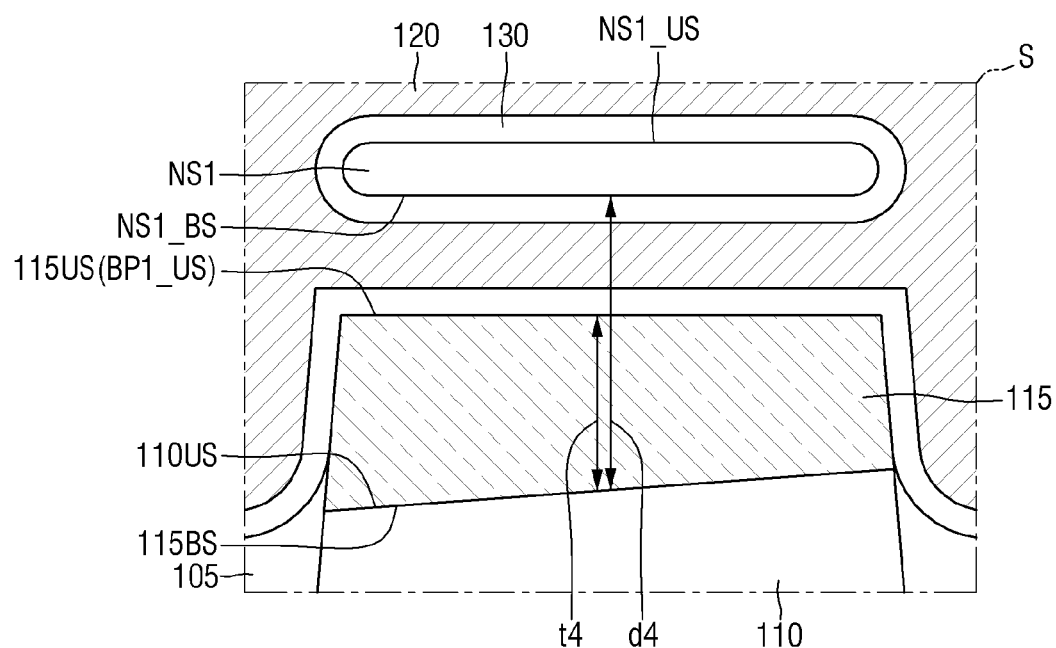
Figure 17:
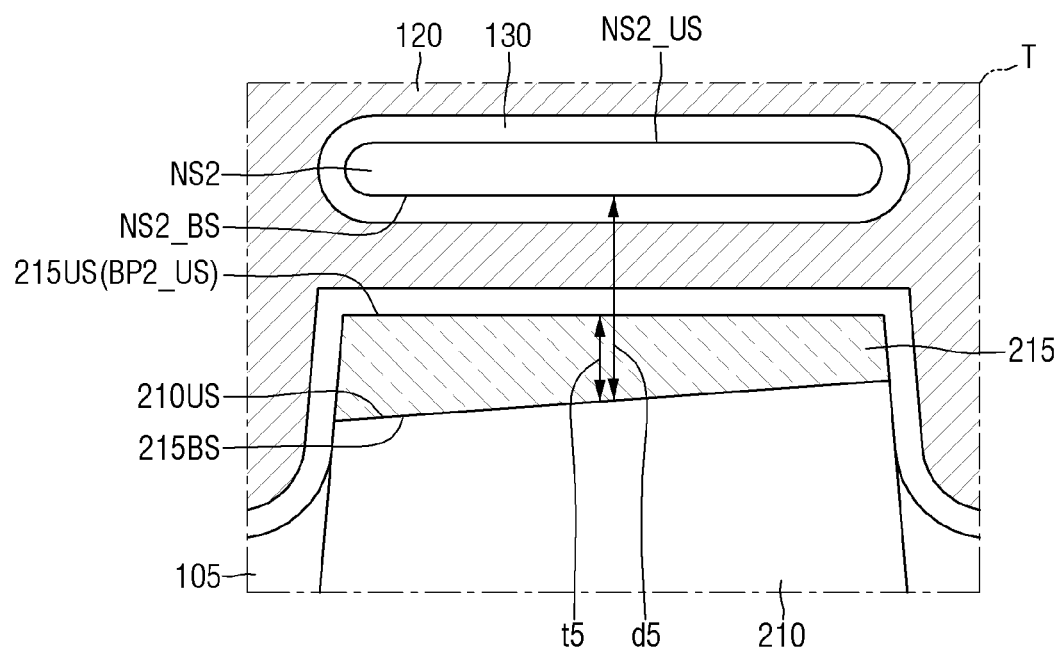

For reference, FIGS. 14 and 15 are cross-sectional views taken along A-A and B-B of FIG. 1. FIG. 16 is an enlarged view of a portion S of FIG. 15. FIG. 17 is an enlarged view of a portion T of FIG. 15.

Referring to FIGS. 14 to 17, in the semiconductor device according to example embodiments, a thickness t4 of the first capping pattern 115 is different from a thickness t5 of the second capping pattern 215.

A depth d4 from the lower surface NST_BS of the first sheet pattern to the upper surface 110US of the first protruding pattern is different a depth d5 from the lower surface NS2_BS of the second sheet pattern to the upper surface 210US of the second protruding pattern.

A depth (d4-t4) from the lower surface NS1_BS of the first sheet pattern to the upper surface 115US of the first capping pattern may be the same as a depth (d5-t5) from the lower surface NS2_BS of the second sheet pattern to the upper surface 215US of the second capping pattern.

The first capping pattern 115 will be explained as an example. The first sheet pattern NS1 may include a third terminating end and a fourth terminating end spaced apart in the second direction D1. The third and fourth terminating ends may be opposite ends of the same first sheet pattern NS1. In FIG. 16, the thickness t4 of the first capping pattern 115 may be measured halfway between the third terminating end of the first sheet pattern NS1 and the fourth terminating end of the first sheet pattern NS1. Also, the depth d4 from the lower surface NS1_BS of the first sheet pattern to the upper surface 110US of the first protruding pattern may be measured halfway between the third end of the first sheet pattern NS1 and the fourth end of the first sheet pattern NS1.

In a cross-sectional view of the gate electrode 120 taken in the second direction D2, a connection line that connects the upper surfaces 110US of the first protrusion patterns continuously disposed in the second direction D2 may have a sawtooth shape.

However, as shown in FIG. 14, the thickness of the first capping pattern 115 may be constant in a cross-sectional view taken along the first direction D1. For example, the thickness of the first capping pattern 115 at the portion that overlaps the gate structure GS may not change depending on the positions.

Figure 18:
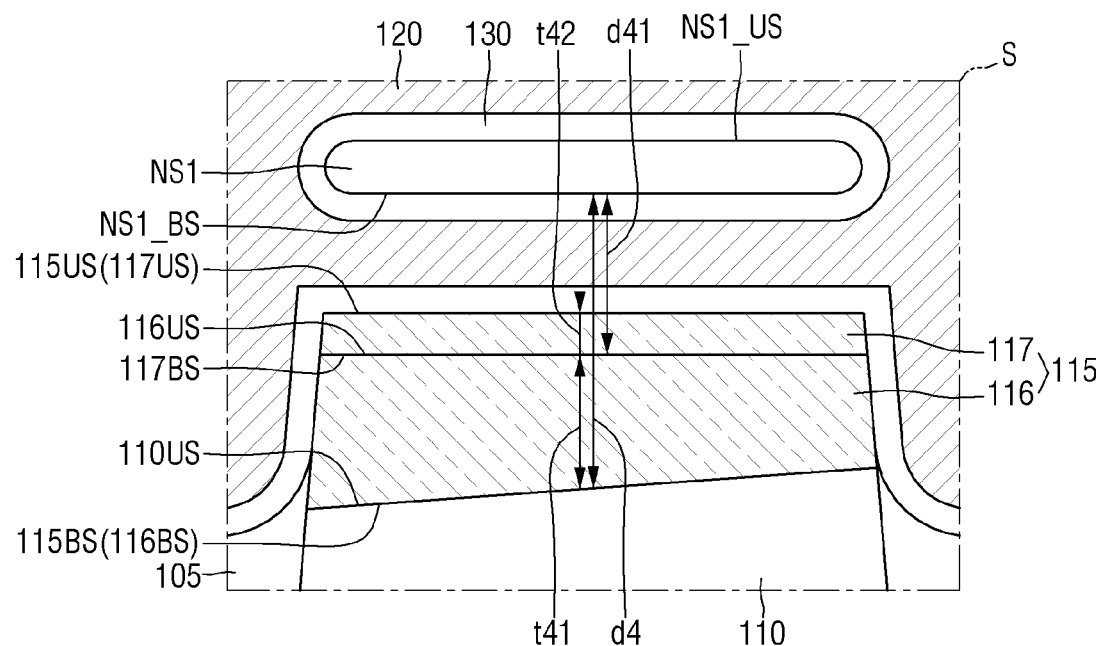
FIGS. 18 and 19 are diagrams for explaining a semiconductor device according to example embodiments.
Figure 19:
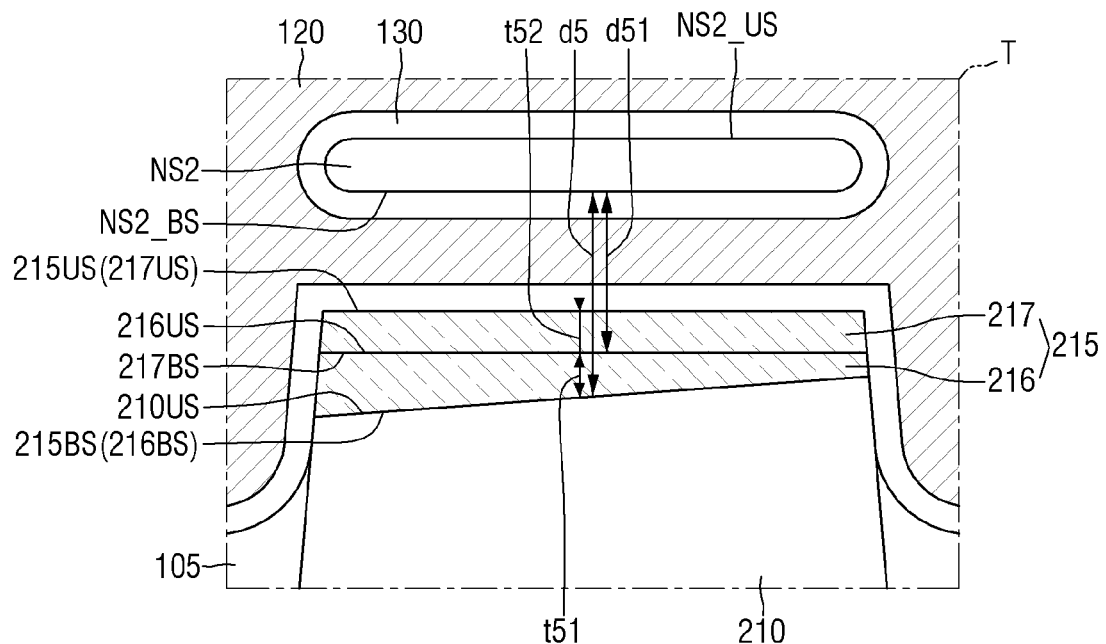

FIGS. 18 and 19 are diagrams for explaining a semiconductor device according to example embodiments. For convenience of explanation, the explanation will focus on points different from those explained using FIGS. 14 to 17.

For reference, FIGS. 18 and 19 are enlarged views showing a portion S and a portion T of FIG. 15.

Referring to FIGS. 18 and 19, in a semiconductor device according to example embodiments, the first capping pattern 115 includes a first lower capping pattern 116 and a first upper capping pattern 117, and the second capping pattern 215 may include a second lower capping pattern 216 and a second upper capping pattern 217.

The first capping pattern 115 may include a first lower capping pattern 116 and a first upper capping pattern 117 that are sequentially disposed on the first protruding pattern 110. The first lower capping pattern 116 is in contact with the first protruding pattern 110. The first lower capping pattern 116 is disposed between the first protruding pattern 110 and the first upper capping pattern 117.

The second capping pattern 215 may include a second lower capping pattern 216 and a second upper capping pattern 217 that are sequentially disposed on the second protruding pattern 210. The second lower capping pattern 216 is in contact with the second protruding pattern 210. The second lower capping pattern 216 is disposed between the second protruding pattern 210 and the second upper capping pattern 217.

The lower surface 116BS of the first lower capping pattern may be the lower surface 115BS of the first capping pattern. The upper surface 117US of the first upper capping pattern may be the upper surface 115US of the first capping pattern. The lower surface 216BS of the second lower capping pattern may be the lower surface 215BS of the second capping pattern. The upper surface 217US of the second upper capping pattern may be the upper surface 215US of the second capping pattern.

The first lower capping pattern 116 and the second lower capping pattern 216 include the same material. The first upper capping pattern 117 and the second upper capping pattern 217 include the same material. The lower capping patterns 116 and 216 include a material different from the upper capping patterns 117 and 217.

The lower capping patterns 116 and 216 may include, for example, one of an undoped silicon film, a silicon germanium film, and a carbon-doped silicon film. The upper capping patterns 117 and 217 may include, for example, one of an undoped silicon film, a silicon germanium film, and a carbon-doped silicon film.

A thickness t41 of the first lower capping pattern 116 is different from a thickness t51 of the second lower capping pattern 216. A thickness t42 of the first upper capping pattern 117 may be the same as a thickness t52 of the second upper capping pattern 217.

A depth d41 from the lower surface NS1_BS of the first sheet pattern to the upper surface 116US of the first lower capping pattern may be the same as a depth d51 from the lower surface NS2_BS of the second sheet pattern to the upper surface 216US of the second lower capping pattern.

A difference between the thickness of the first capping pattern 115 and the thickness of the second capping pattern 215 may be a difference in thicknesses of the lower capping patterns 116 and 216.

Figure 20:
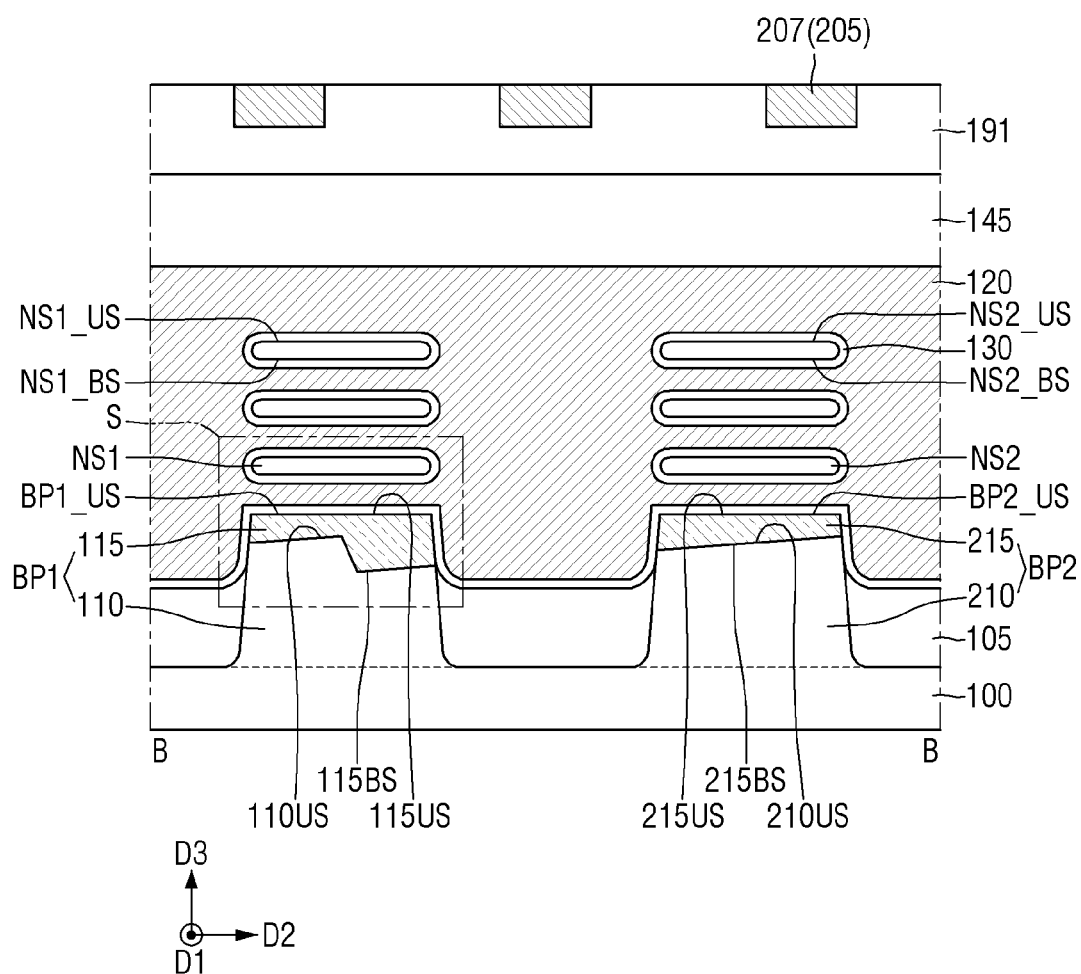
FIGS. 20 and 21 are diagrams for explaining a semiconductor device according to example embodiments.
Figure 21:
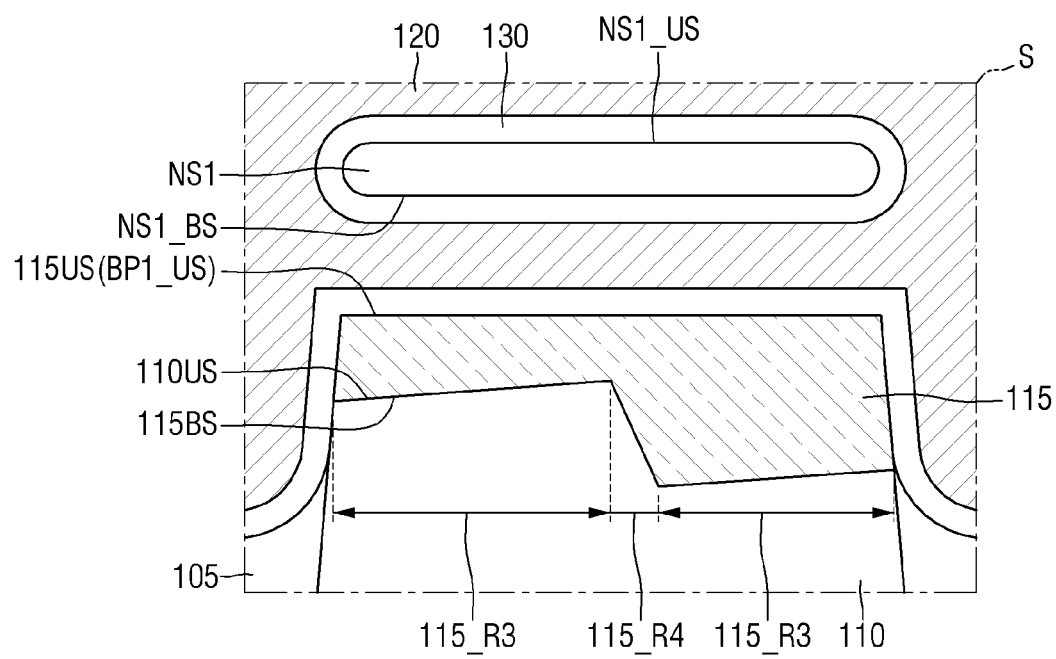

FIGS. 20 and 21 are diagrams for explaining a semiconductor device according to example embodiments. For convenience of explanation, the explanation will focus on points different from those explained using FIGS. 14 to 17.

For reference, FIG. 21 is an enlarged view of a portion S of FIG. 20. Since the description of the second lower pattern BP2 is substantially the same as that described using FIGS. 15 and 17, the first lower pattern BPT will be described below.

Referring to FIGS. 20 and 21, in the semiconductor device according to example embodiments, the slope of the lower surface 115BS of the first capping pattern may change abruptly.

The first capping pattern 115 may include a third portion 115_R3 and a fourth portion 115_R4. When the lower surface 115BS of the first capping pattern has a positive slope in the third portion 115_R3 of the first capping pattern, the lower surface 115BS of the first capping pattern may have a negative slope in the fourth portion 115_R4 of the first capping pattern.

In FIG. 21, the first lower pattern BPT may include a first side wall and a second side wall that are opposite to each other in the second direction D2. The thickness of the third portion 115_R3 of the first capping pattern 115 may decrease, as it goes away from the first side wall of the first lower pattern BP1. The thickness of the fourth portion 115_R4 of the first capping pattern 115 may increase, as it goes away from the first side wall of the first lower pattern BP1.

Unlike the shown example, the lower surface 115BS of the first capping pattern in the fourth portion 115_R4 of the first capping pattern may have a stepped shape that is inclined toward the substrate 100.

FIGS. 22 to 34 are intermediate step diagrams for describing a method for fabricating a semiconductor device according to example embodiments.

Figure 22:
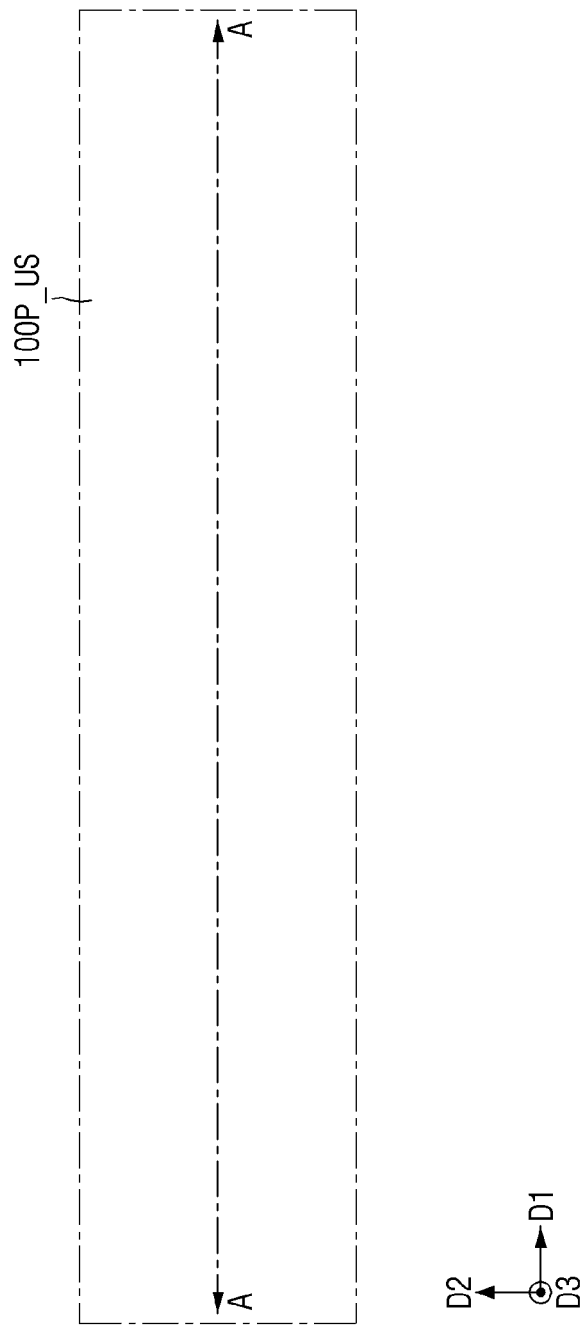
FIGS. 22 to 34 are diagrams for describing a method for fabricating a semiconductor device according to example embodiments.
Figure 23:
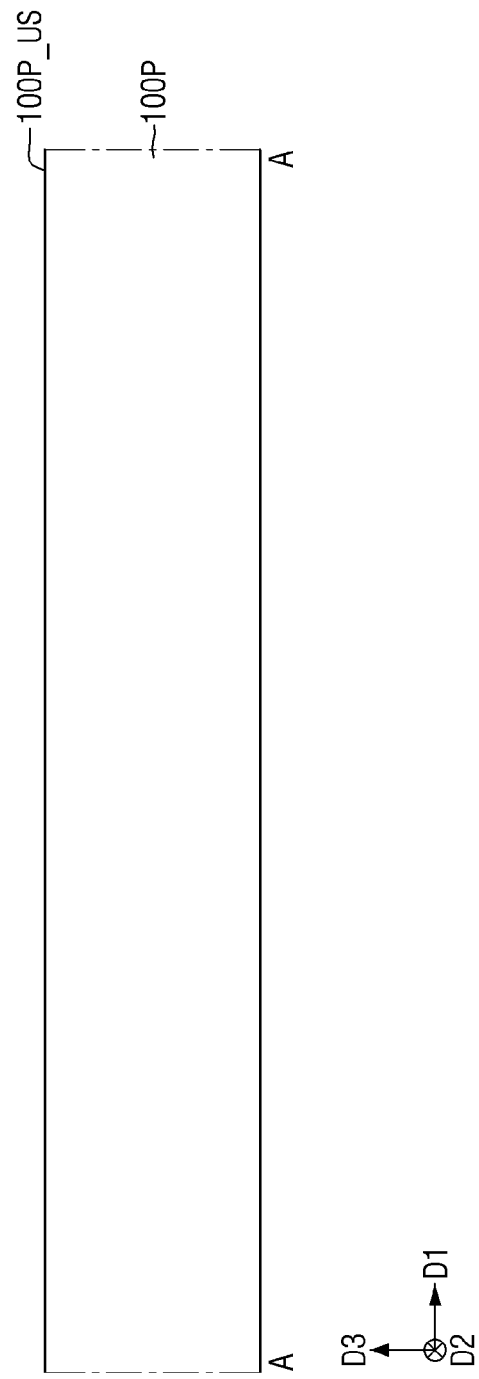

Referring to FIGS. 22 and 23, a pre substrate 100P is provided. An upper surface 100P_US of the pre substrate may be substantially planar.

The pre substrate 100P includes a (110) silicon wafer. For example, the pre substrate 100P may include an off-cut (110) silicon wafer. The upper surface 100P_US of the pre substrate may form an off-cut angle with the (110) silicon crystal plane.

Figure 25:
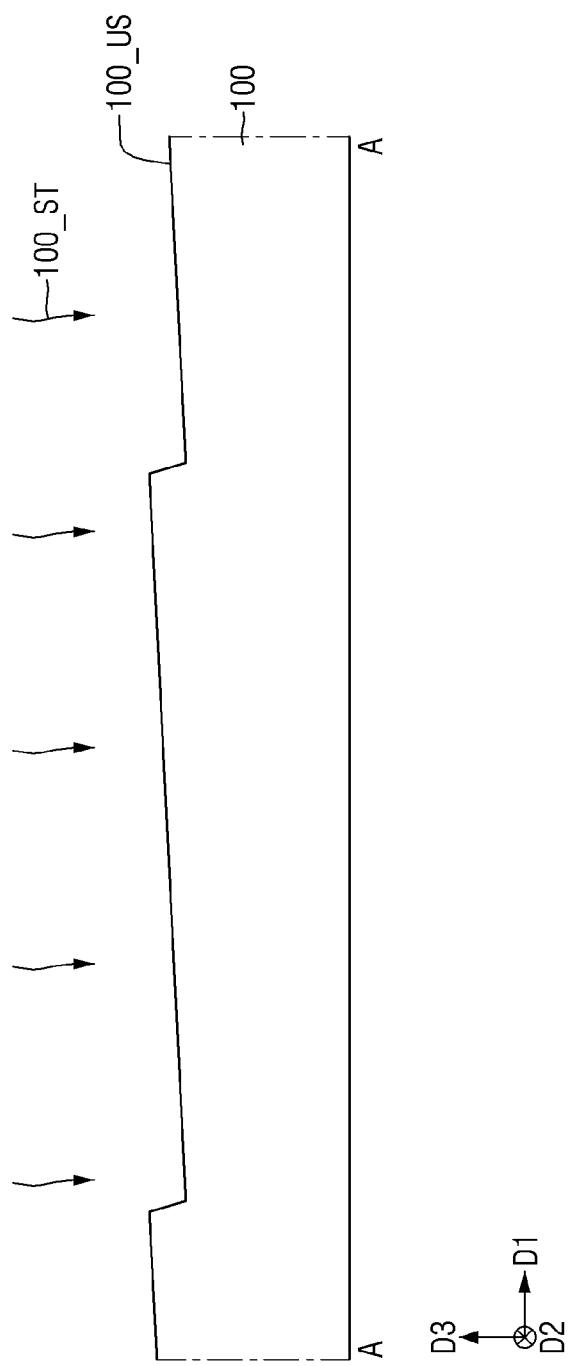

The off-cut (110) silicon wafer may be used to grow an epitaxial film of high-quality on the substrate (e.g., substrate 100 of FIG. 25).

Figure 24:
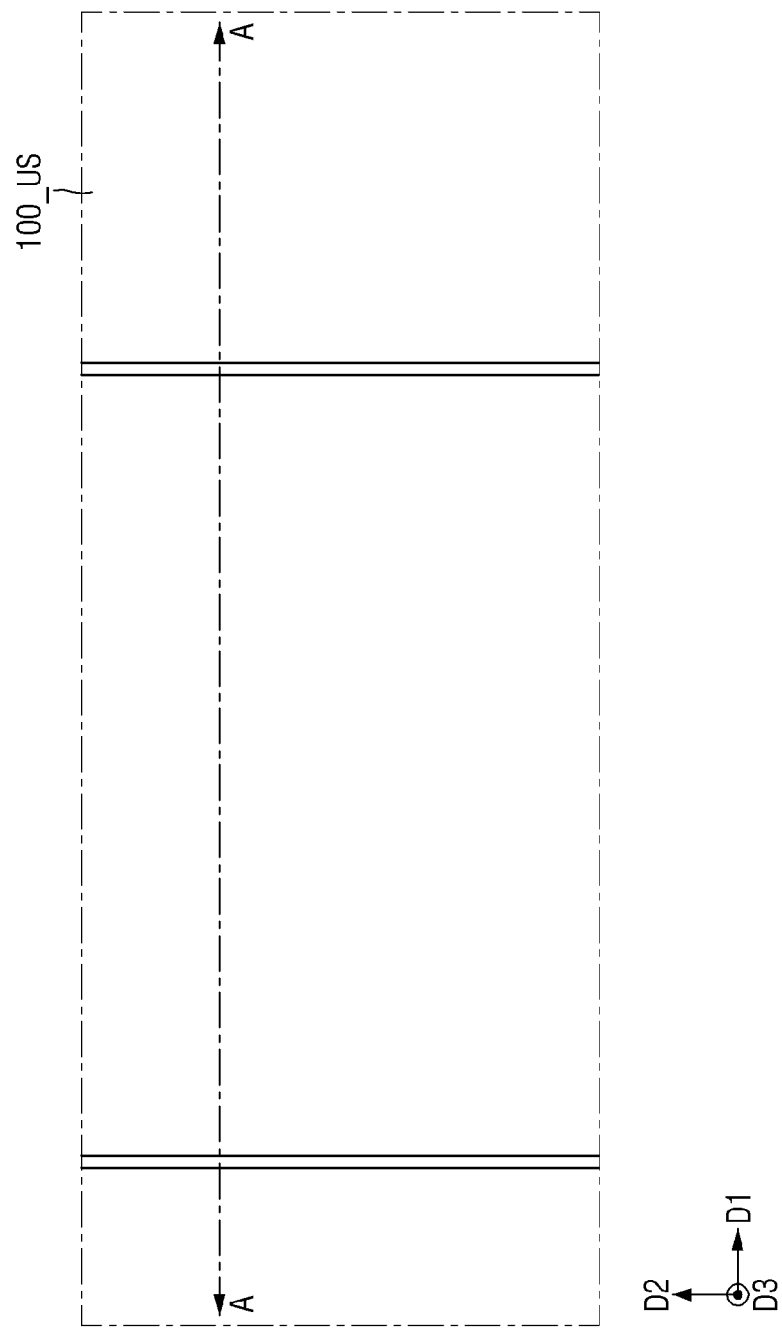

Referring to FIGS. 24 and 25, the pre substrate 100P may be surface treated through a surface treatment process 100_ST.

The substrate 100 may be formed through the surface treatment process 100_ST. The surface treatment process 100_ST may include, for example, but not be limited to, a hydrogen bake process.

The planar upper surface of the pre substrate (e.g., pre substrate 100P_US of FIG. 23) may change through the surface treatment process 100_ST. The upper surface 100_US of the substrate may include a sawtooth structure.

Figure 26:
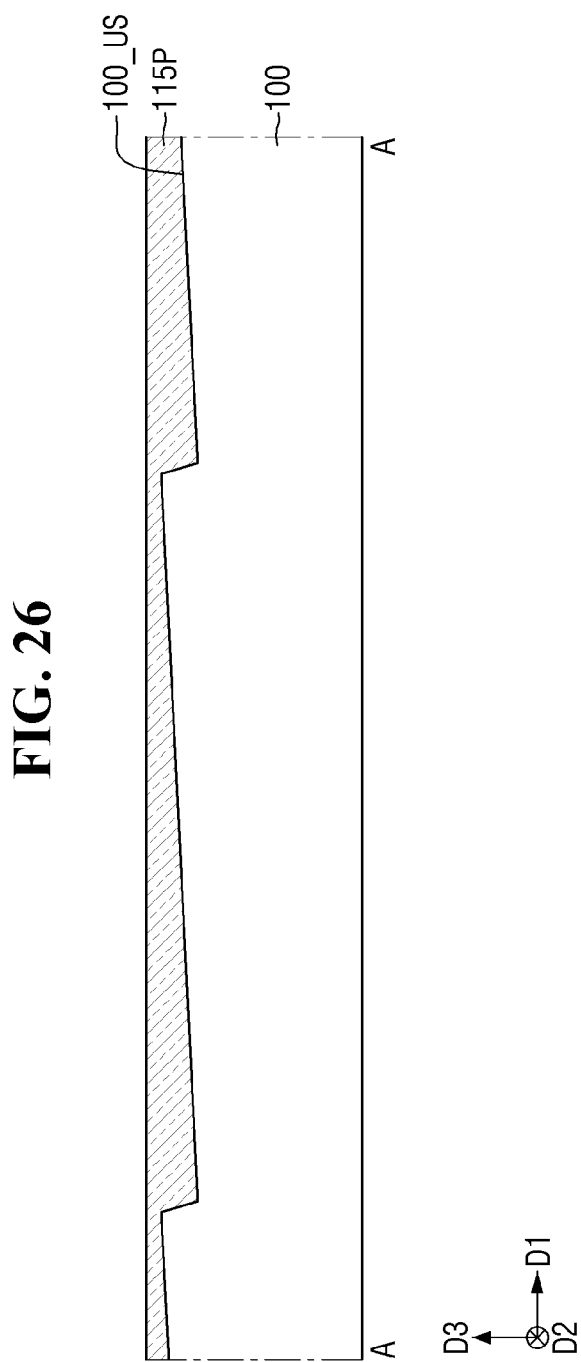

Referring to FIG. 26, a capping film 115P is formed on the upper surface 100_US of the substrate.

The capping film 115P covers the upper surface 100_US of the sawtooth-shaped substrate. The upper surface of the capping film 115P may be substantially planar.

The capping film 115P may be formed using, for example, an epitaxial growth process. The capping film 115P may include, for example, at least one of an undoped silicon film, a silicon germanium film, and a carbon-doped silicon film.

Figure 27:
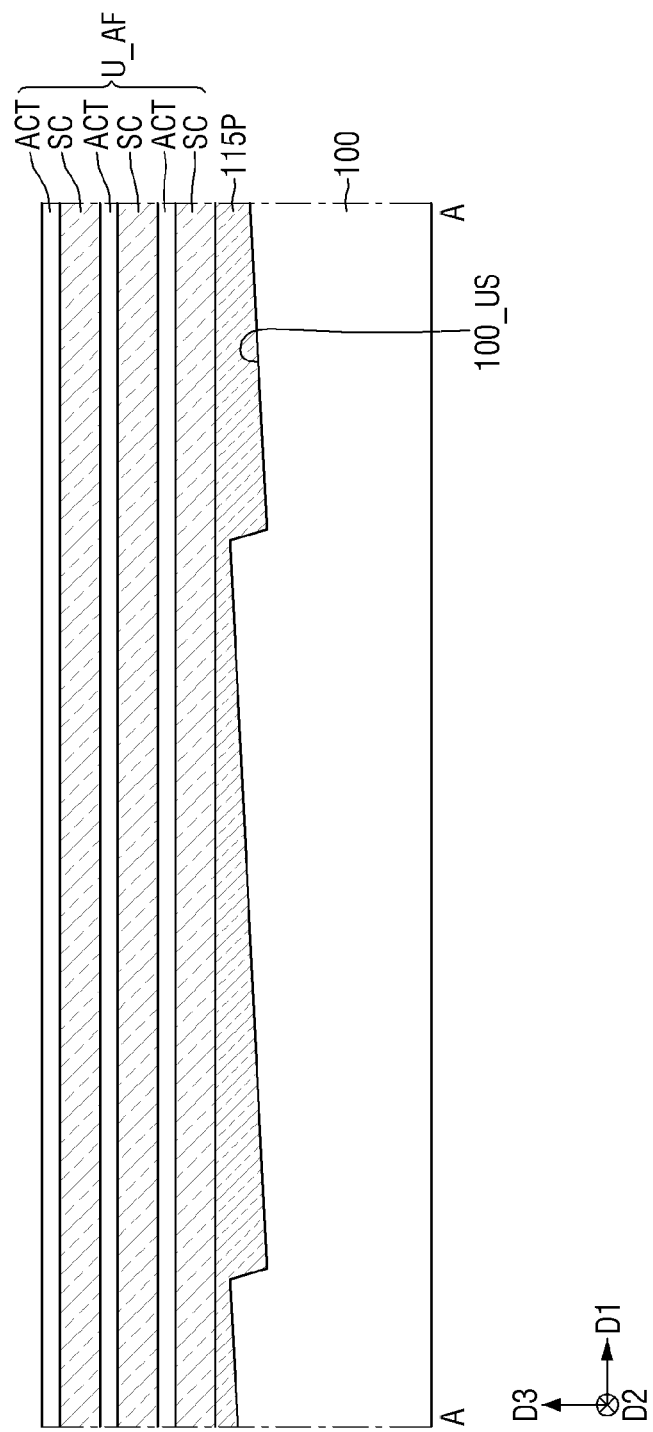

Referring to FIG. 27, an upper pattern film U_AF is formed on the capping film 115P.

The upper pattern film U_AF may include a plurality of sacrificial pattern films SC and a plurality of active pattern films ACT that are alternately stacked on the capping film 115P. The lowermost sacrificial pattern film SC may be in contact with the capping film 115P.

For example, the active pattern film ACT may include a silicon film. The sacrificial pattern film SC may include a silicon-germanium film. The active pattern film ACT may include, for example, a silicon film oriented in the (110) plane. The sacrificial pattern film SC may include, for example, a silicon-germanium film oriented in the (110) plane.

Figure 28:
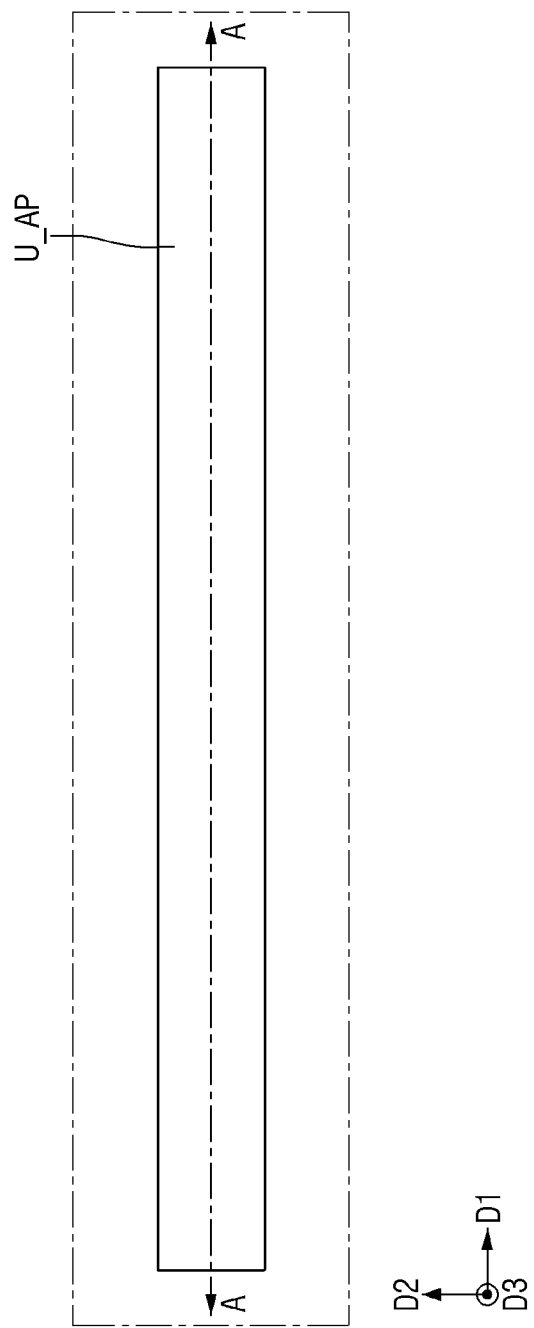

Referring to FIGS. 27 to 29, a first lower pattern BP1 and an upper pattern structure U_AP may be formed on the substrate 100.

The first lower pattern BP1 extends lengthwise in the first direction D1. The first lower pattern BP1 includes a first protruding pattern 110 and a first capping pattern 115. A part of the substrate 100 and the capping film 115P may be patterned to form the first lower pattern BPT.

The upper pattern structure U_AP is disposed on the first lower pattern BPT. The upper pattern structure U_AP may be in contact with the first lower pattern BPT. The upper pattern structure U_AP may be formed by patterning the upper pattern film U_AF.

The upper pattern structure U_AP may include a plurality of sacrificial patterns SC_L and a plurality of active patterns ACT_L that are alternately stacked on the first lower pattern BPT.

A field insulating film 105 may be formed on the substrate 100 after the first lower pattern BPT and the upper pattern structure U_AP are formed.

Figure 30:
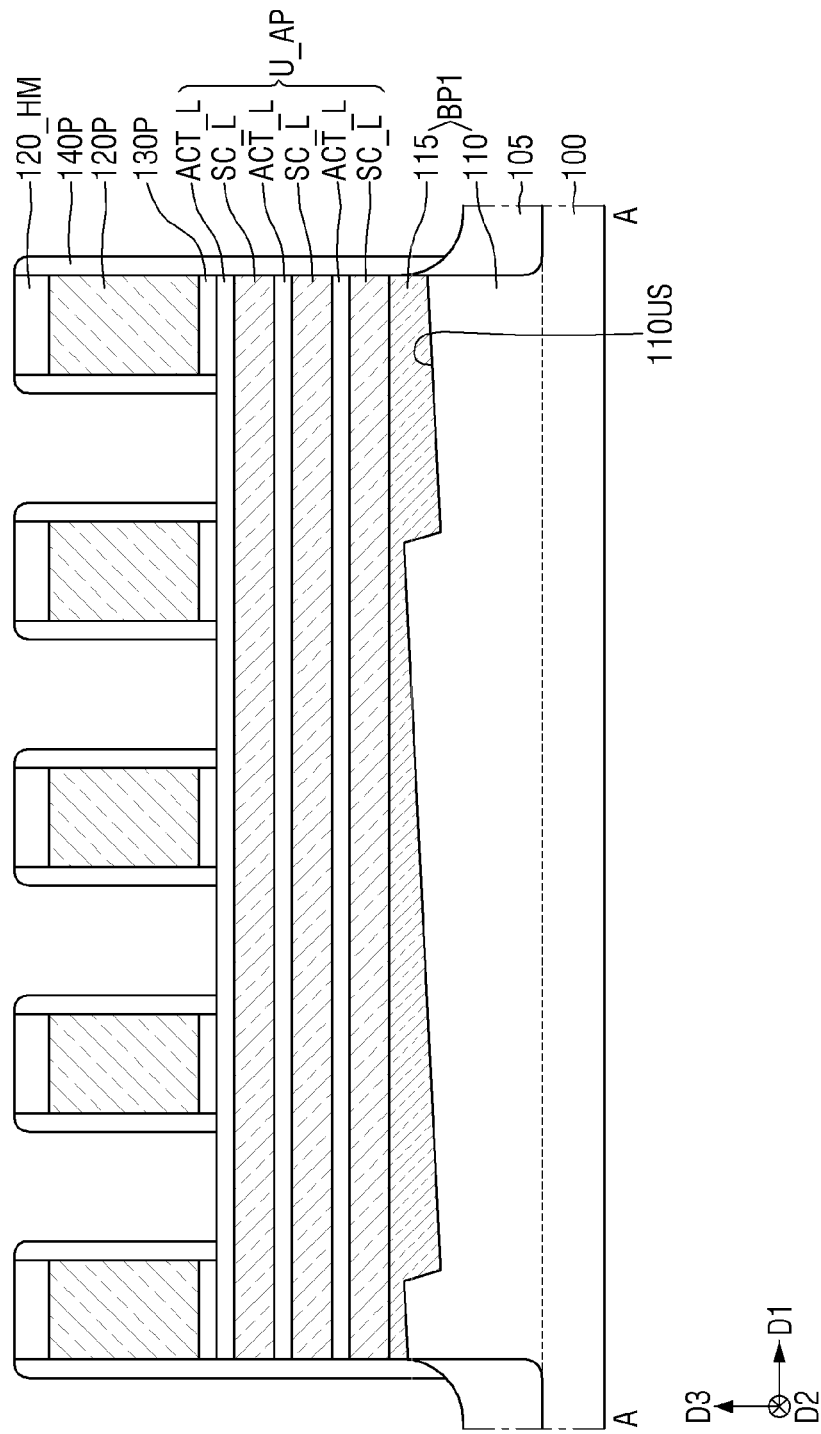

Referring to FIG. 30, a plurality of dummy gate electrodes 120P extending in the second direction D2 are formed on the upper pattern structure U_AP.

A dummy gate insulating film 130P is formed between the dummy gate electrode 120P and the upper pattern structure U_AP. A dummy gate capping film 120_HM is disposed on the dummy gate electrode 120P. The dummy gate capping film 120_HM extends along the upper surface of the dummy gate electrode 120P.

The dummy gate insulating film 130P may include, for example, but not limited to, silicon oxide. The dummy gate electrode 120P may include, for example, but not limited to, polysilicon. The dummy gate capping film 120_HM may include, for example, but not limited thereto, silicon nitride.

Subsequently, a dummy gate spacer 140P is formed on side walls of the dummy gate electrode 120P. Although the dummy gate spacer 140P is shown to cover the single side wall of the upper pattern structure U_AP, embodiments are not limited thereto. Unlike the shown example, the single side wall of the upper pattern structure U_AP may be covered by the dummy gate electrode 120P.

Figure 31:
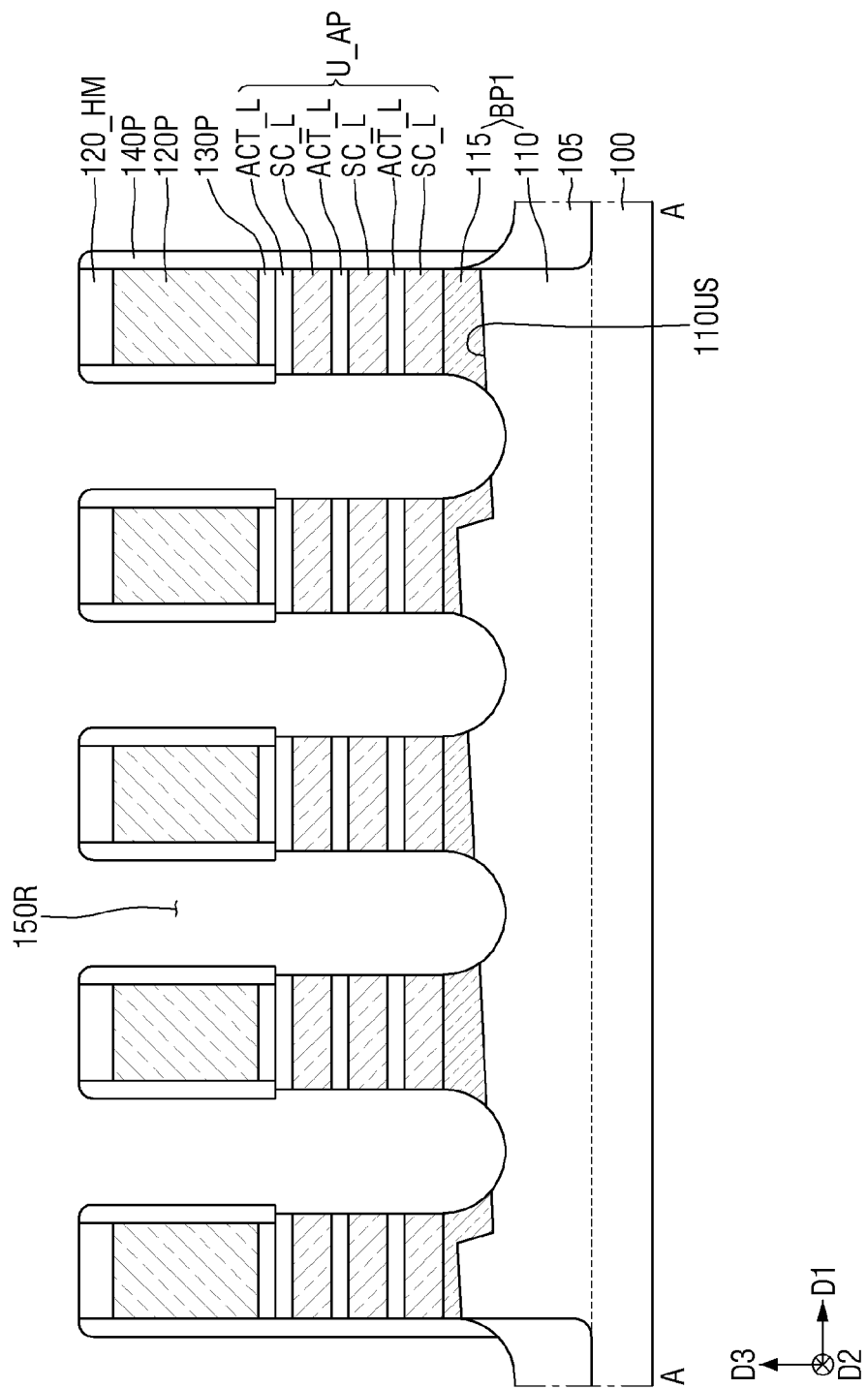

Referring to FIG. 31, a source/drain recess 150R is formed inside the upper pattern structure U_AP and the first lower pattern BP1, using the dummy gate electrode 120P as a mask.

A bottom surface of the source/drain recess 150R may be defined by the first lower pattern BP1.

Figure 32:
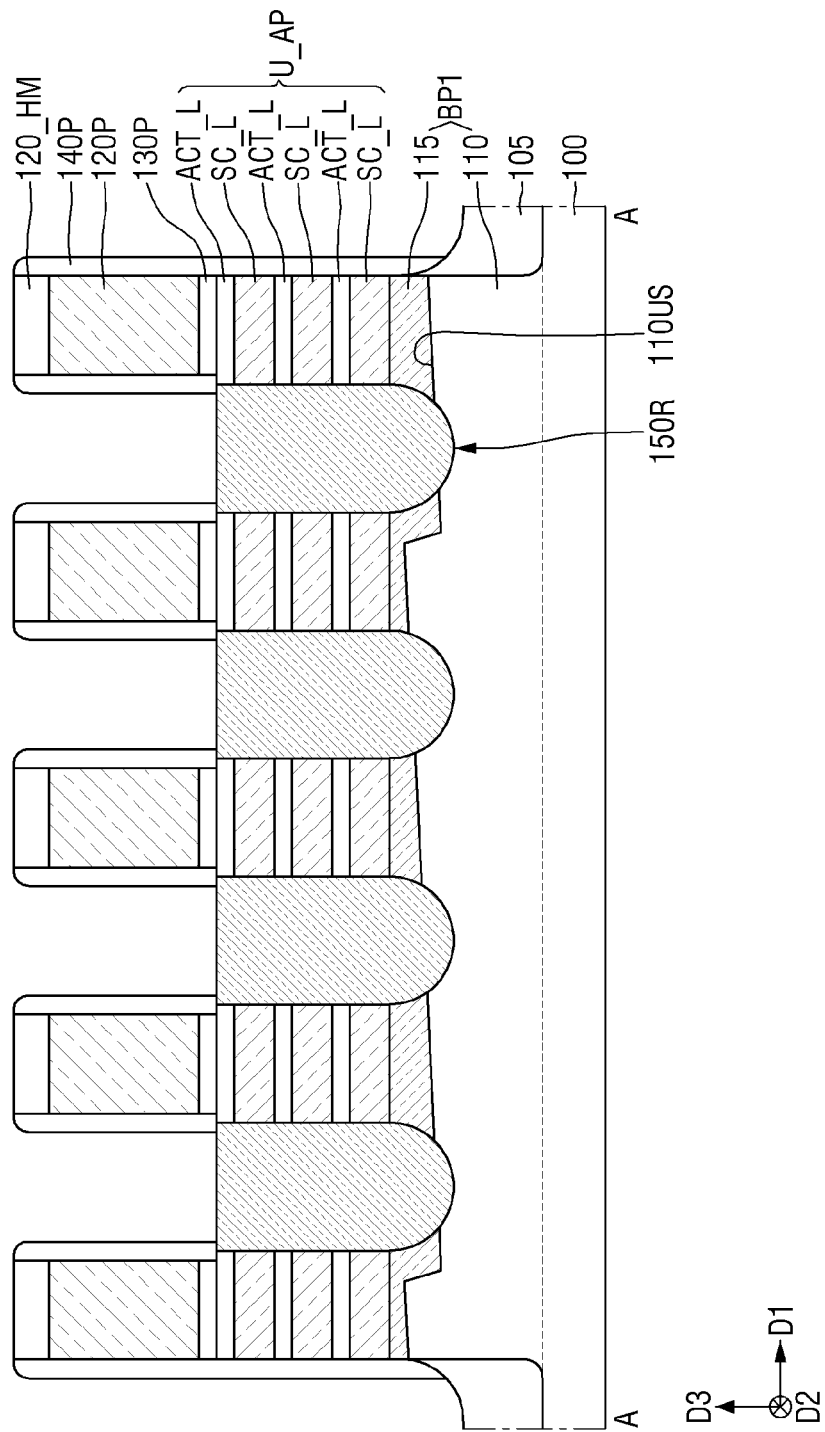

Referring to FIG. 32, a first source/drain pattern 150 is formed on the first lower pattern BP1.

The first source/drain pattern 150 fills the source/drain recess 150R. The first source/drain pattern 150 is formed between the dummy gate electrodes 120P adjacent to each other in the first direction D1. The first source/drain pattern 150 is connected to the active pattern ACT_L. The first source/drain pattern 150 may be in contact with the first lower pattern BP1. For example, the first source/drain pattern 150 may be in contact with the first protruding pattern 110 and the first capping pattern 115.

Figure 33:
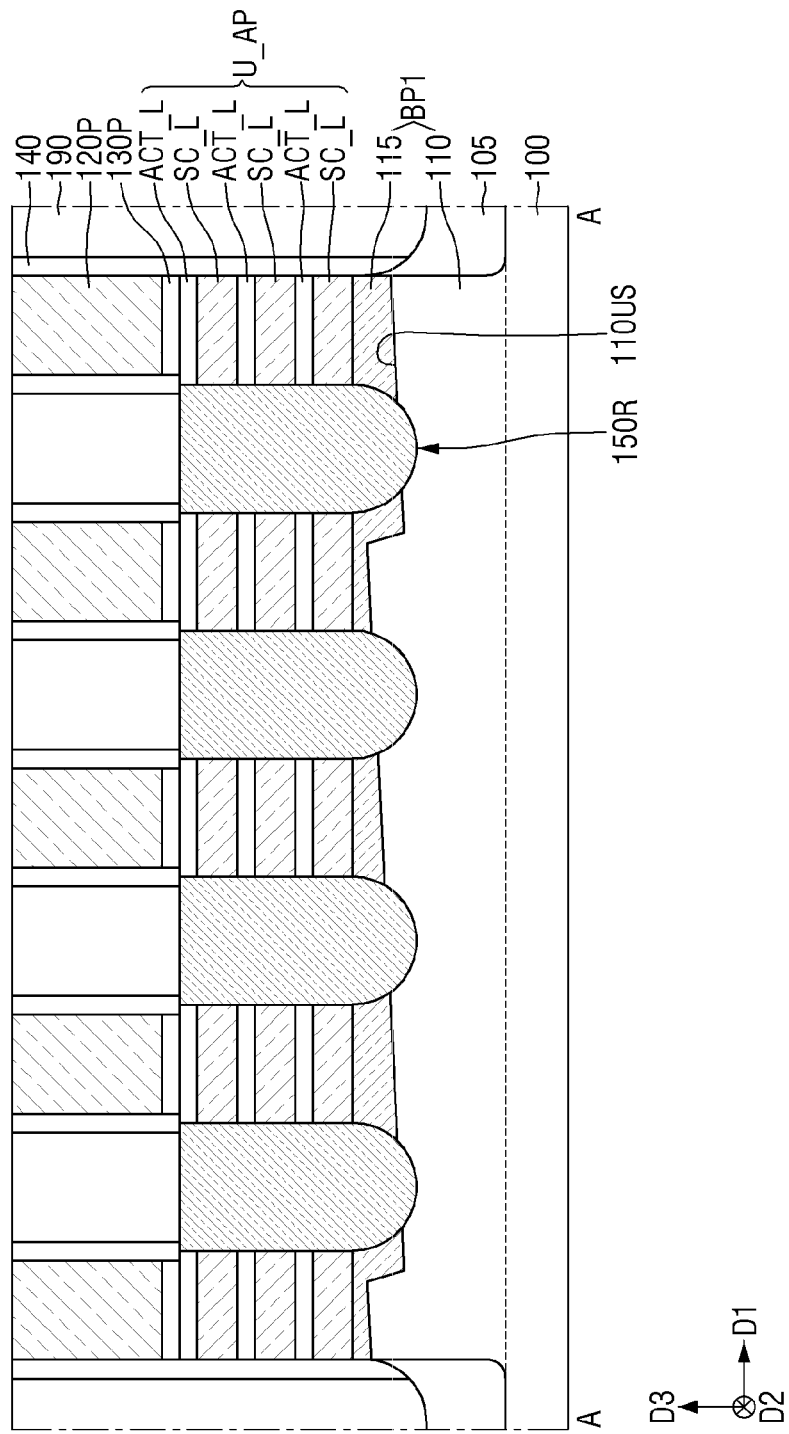

Referring to FIGS. 33, a first interlayer insulating film 190 is formed on the first source/drain pattern 150.

Subsequently, a part of the first interlayer insulating film 190 and the dummy gate capping film 120_HM are removed to expose the upper surface of the dummy gate electrode 120P. A gate spacer 140 may be formed, while the upper surface of the dummy gate electrode 120P is exposed.

Figure 34:
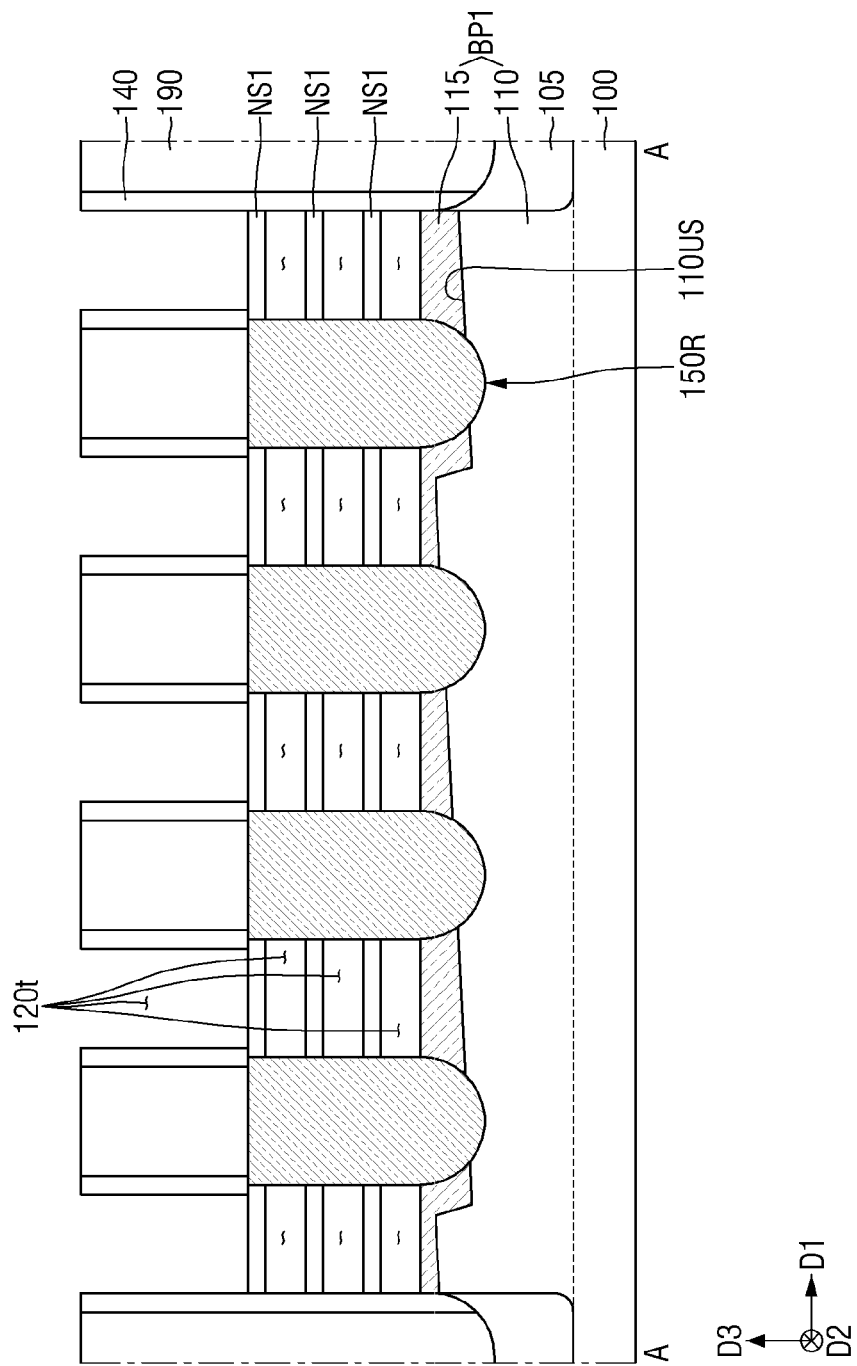

Referring to FIG. 34, the upper pattern structure U_AP between the gate spacers 140 may be exposed, by removing the dummy gate insulating film 130P and the dummy gate electrode 120P.

After that, the first sheet pattern NS1 may be formed, by removing the sacrificial pattern SC_L. As a result, a gate trench 120t is formed between the gate spacers 140. Also, a first sheet pattern NS1 connected to the first source/drain pattern 150 is formed.

Next, referring to FIG. 2, a gate insulating film 130 and a gate electrode 120 may be formed inside the gate trench 120t. Additionally, a gate capping pattern 145 may be formed.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:
   an active pattern which includes a lower pattern extending lengthwise in a first direction and a plurality of sheet patterns spaced apart from the lower pattern in a second direction on a substrate, the lower pattern including a protruding pattern protruding from the substrate in the second direction, and a capping pattern on and contacting the protruding pattern;
   a first gate structure and a second gate structure which are disposed on the lower pattern and spaced apart from each other in the first direction; and
   a source/drain pattern which is disposed on the lower pattern and in contact with the plurality of sheet patterns,
   wherein a thickness of the capping pattern in a portion that overlaps the first gate structure is different from a thickness of the capping pattern in a portion that overlaps the second gate structure.

2. The semiconductor device of claim 1, wherein the capping pattern includes one of a silicon germanium film and a carbon-doped silicon film.

3. The semiconductor device of claim 1, wherein the capping pattern includes a lower capping pattern and an upper capping pattern which are sequentially disposed on an upper surface of the protruding pattern.

4. The semiconductor device of claim 3,
   wherein a thickness of the lower capping pattern in a portion that overlaps the first gate structure is different from a thickness of the capping pattern in a portion that overlaps the second gate structure, and
   wherein a thickness of the upper capping pattern in a portion that overlaps the first gate structure is the same as a thickness of the upper capping pattern in a portion that overlaps the second gate structure.

5. The semiconductor device of claim 3, wherein the lower capping pattern includes one of a silicon germanium film and a carbon-doped silicon film.

6. The semiconductor device of claim 3, wherein the upper capping pattern includes one of an undoped silicon film, a silicon germanium film, and a carbon-doped silicon film.

7. The semiconductor device of claim 1,
   wherein the first gate structure includes a gate insulating film and a gate electrode,
   wherein the first gate structure includes an inner gate structure which is disposed between the lower pattern and an adjacent sheet pattern, and between sheet patterns adjacent in the second direction, and
   wherein the inner gate structure includes the gate electrode and the gate insulating film.

8. The semiconductor device of claim 7, wherein the source/drain pattern is in contact with the gate insulating film of the inner gate structure.

9. The semiconductor device of claim 7, wherein the first gate structure includes an inner spacer which is disposed between the lower pattern and the adjacent sheet pattern, and between the sheet patterns adjacent in the second direction.

10. The semiconductor device of claim 1, wherein the substrate includes a (110) silicon wafer.

11. The semiconductor device of claim 1,
wherein each of the plurality of sheet patterns includes an upper surface and a lower surface that are opposite in the second direction, and
wherein each of the upper surface and the lower surface of each of the plurality of sheet patterns has a (110) crystal plane.

12. A semiconductor device comprising:
an active pattern which includes a lower pattern extending lengthwise in a first direction and a plurality of sheet patterns spaced apart from the lower pattern in a second direction on a substrate, the lower pattern including a protruding pattern protruding from the substrate in the second direction, and a capping pattern on and contacting the protruding pattern;
a first gate structure including a gate electrode and a gate insulating film on the lower pattern; and
a source/drain pattern which is disposed on the lower pattern and in contact with the plurality of sheet patterns,
wherein the first gate structure includes an inner gate structure which is disposed between the lower pattern and an adjacent sheet pattern, and between sheet patterns adjacent in the second direction,
wherein the inner gate structure includes the gate electrode and the gate insulating film,
wherein the gate insulating film of the inner gate structure is in contact with an upper surface of the capping pattern,
wherein each of the plurality of sheet patterns includes an upper surface and a lower surface that are opposite to each other in the second direction, and
wherein each of the upper surface and the lower surface of each of the plurality of sheet patterns has a (110) crystal plane.

13. The semiconductor device of claim 12, further comprising:
a second gate structure which is disposed on the lower pattern and spaced apart from the first gate structure in the first direction,
wherein a thickness of the capping pattern in a portion that overlaps the first gate structure is different from a thickness of the capping pattern in a portion that overlaps the second gate structure.

14. The semiconductor device of claim 12, wherein the capping pattern includes at least one of an undoped silicon film, a silicon germanium film, and a carbon-doped silicon film.

15. The semiconductor device of claim 14, wherein the capping pattern includes a lower capping pattern that is in contact with the protruding pattern, and an upper capping pattern on the lower capping pattern.

16. The semiconductor device of claim 12, wherein the source/drain pattern is in contact with the gate insulating film of the inner gate structure.

17. The semiconductor device of claim 12, wherein the first gate structure includes an inner spacer which is disposed between the lower pattern and the adjacent sheet pattern, and between the sheet patterns adjacent in the second direction.

18. A semiconductor device comprising:
a substrate including a (110) silicon wafer;
an active pattern which includes a lower pattern extending lengthwise in a first direction and a plurality of sheet patterns spaced apart from the lower pattern in a second direction on the substrate, the lower pattern including a protruding pattern protruding from the substrate in the second direction, and a first capping pattern on and contacting the protruding pattern;
a first gate structure and a second gate structure disposed on the lower pattern and spaced apart from each other in the first direction; and
a source/drain pattern which is disposed on the lower pattern and in contact with the plurality of sheet patterns,
wherein a thickness of the first capping pattern in a portion that overlaps the first gate structure is different from a thickness of the first capping pattern in a portion that overlaps the second gate structure,
wherein each of the plurality of sheet patterns includes an upper surface and a lower surface that are opposite in the second direction, and
wherein each of the upper surface and the lower surface of each of the plurality of sheet patterns has a (110) crystal plane.

19. The semiconductor device of claim 18, wherein the first capping pattern includes one of a silicon germanium film and a carbon-doped silicon film.

20. The semiconductor device of claim 18,
wherein the lower pattern further includes a second capping pattern on the first capping pattern, and
wherein the second capping pattern includes one of an undoped silicon film, a silicon germanium film, and a carbon-doped silicon film.

* * * * *